(12) United States Patent
Wehrmann et al.

(10) Patent No.: US 6,541,128 B2
(45) Date of Patent: *Apr. 1, 2003

(54) ELECTROLUMINESCENT ARRANGEMENTS USING BLEND SYSTEMS

(75) Inventors: Rolf Wehrmann, Krefeld (DE); Andreas Elschner, Mülheim a.d. Ruhr (DE); Martin Hueppauff, Stuttgart (DE); Christoph Jonda, Stuttgart (DE); David Terrell, Lint (BE); Dirk Quintens, Lier (BE); Hartwig Andries, Mortsel (BE)

(73) Assignee: Bayer Aktiengesellschaft (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/214,316

(22) PCT Filed: Jul. 1, 1997

(86) PCT No.: PCT/EP97/03439

§ 371 (c)(1),
(2), (4) Date: Feb. 9, 1999

(87) PCT Pub. No.: WO98/02018

PCT Pub. Date: Jan. 15, 1998

(65) Prior Publication Data

US 2002/0136921 A1 Sep. 26, 2002

(30) Foreign Application Priority Data

Jul. 5, 1996 (DE) .......................... 196 27 070

(51) Int. Cl.⁷ .............................................. H05B 33/14
(52) U.S. Cl. ..................... 428/690; 428/917; 313/504
(58) Field of Search ................ 428/690, 704, 428/917; 313/504, 506

(56) References Cited

U.S. PATENT DOCUMENTS

| | | | |
|---|---|---|---|
| 4,539,507 A | 9/1985 | VanSlyke et al. | 313/504 |
| 4,769,262 A | 9/1988 | Ferrar et al. | 428/35 |
| 4,769,292 A | 9/1988 | Tang et al. | 428/690 |
| 4,923,774 A | 5/1990 | Van der Auweraer et al. | 430/59 |
| 5,077,142 A | 12/1991 | Sakon et al. | 428/690 |
| 5,487,953 A | 1/1996 | Shirota et al. | 428/690 |
| 5,554,450 A | 9/1996 | Shi et al. | 428/690 |
| 5,766,515 A | 6/1998 | Jonas et al. | 252/500 |
| 6,277,504 B1 * | 8/2001 | Koch et al. | 428/690 |

FOREIGN PATENT DOCUMENTS

| | | |
|---|---|---|
| EP | 0 278 757 | 8/1988 |
| EP | 0 278 758 | 8/1988 |
| EP | 0 294 061 | 12/1988 |
| EP | 0 406 762 | 1/1991 |
| EP | 0 443 861 | 8/1991 |
| EP | 0 532 798 | 3/1993 |
| EP | 0 686 662 | 12/1995 |
| EP | 731 625 | 9/1996 |
| EP | 766 498 | 4/1997 |
| WO | WO 90/13148 | 11/1990 |
| WO | WO 92/03490 | 3/1992 |
| WO | WO 92/03491 | 3/1992 |
| WO | WO 92/16023 | 9/1992 |

OTHER PUBLICATIONS

Tokito et al., Polyarylenevinylene films prepared from precursor polymers soluble in organic solvents. *Polymer*, 31, 1137–1141, Jun. 1990.

Colaneri et al., Photoexcited states in poly(ρ–phenylene vinylene): Comparison with trans, trans–distyrylbenzene, a model oligomer. *Physical Review B*, Dec. 15, 1990–II, 42(18), 11670–11681.

Burn et al., Synthesis of a segmented conjugated polymer chain giving a blue–shifted electroluminescence and improved efficiency. *J. Chem. Soc. Chem. Commun.*, 1992, 32, 32–34. (No Month).

Grem et al., Realization of a blue–light–emitting device using poly(ρ–phenylene). *Advanced Materials*, 1992, 4(1), 36–37. (No Month).

Naito et al., Molecular design for nonpolymeric organic dye glasses with thermal stability: relations between thermodynamic parameters and amorphous properties. *J. Phys. Chem.*, 1993, 97, 6240–6248. (No Month).

Adachi et al., Molecular design of hole transport materials for obtaining high durability in organic electroluminescent diodes. *Appl. Phys. Lett.*, May 15, 1995, 66(20), 2679–2681.

Pommerehne et al., Efficient two layer LEDs on a polymer blend basis. *Advanced Materials*, 1995, 7(6), 551–554. (No Month).

Kido et al., Single–layer white light–emitting organic electroluminescent devices based on dye–dispersed poly(N–vinylcarbazole). *Appl. Phys. Lett.*, Oct. 16, 1995, 67(16), 2281–2283.

Johnson et al., Electroluminescence from single layer molecularly doped polymer films. *Pure & Appl. Chem.*, 1995, 67(1), 175–182. (No Month).

Bröcker, Hydrierung und Dehydrierung, katalytische. *Ullmann* (4), 13, 135–148. (Publication date not given).

* cited by examiner

Primary Examiner—Marie Yamnitzky
(74) Attorney, Agent, or Firm—Connolly Bove Lodge & Hutz LLP

(57) ABSTRACT

An electroluminescent arrangement which contains
  a substrate,
  an anode,
  an electroluminescent element,
  a cathode,
and said anode or said cathode is transparent in the visible spectral range and the electroluminescent element is a single layer containing an optionally substituted tris-1,3,5-(aminophenyl)benzene compound (A), a luminescent component B) or a electron-conducting charge-transporting substance.

18 Claims, No Drawings

ELECTROLUMINESCENT ARRANGEMENTS USING BLEND SYSTEMS

An electroluminescent (EL) arrangement is characterised in that it emits light with current flow on the application of an electrical voltage. In technology such arrangements have for a long time been known by the term "light diodes" (LEDs =light-emitting diodes). The emission of light takes place owing to the fact that positive charges (holes) and negative charges (electrons) recombine with the emission of light.

Nowadays mainly inorganic semiconductors, such as gallium arsenide, are used in the development of light-emitting components for electronics or photonics. Display elements in the form of dots can be produced from such substances. Large-surface arrangements are not possible.

Besides the semiconductor light diodes, electroluminescent arrangements based on vapour-deposited low-molecular organic compounds are known (U.S. Pat. No. 4,539,507, U.S. Pat. No. 4,769,262, U.S. Pat. No. 5,077,142, EP-A 406 762, EP-A 278 758, EP-A 278 757).

Polymers, such as poly(p-phenylenes) and poly(p-phenylenevinylenes) (PPV) are also reported as being electroluminescent polymers: G. Leising et al., Adv. Mater. 4 (1992) No. 1; Friend et al., J. Chem. Soc., Chem. Commun. 32 (1992); Saito et al., Polymer, 1990, Vol. 31, 1137; Friend et al., Physical Review B, Vol. 42, No. 18, 11670 or WO 90/13148. Further examples of PPV in electroluminescent displays are described in EP-A 443 861, WO-A-9203490 and 92003491.

EP-A 0 294 061 introduces an optical modulator based on polyacetylene.

For the production of flexible polymer LEDs, Heeger et al. have proposed soluble conjugated PPV-derivatives (WO 92/16023).

Polymer blends of varying composition are also known: M Stolka et. al., Pure 7 Appt. Chem., Vol. 67, No. 1, pp 175–182, 1995; H. Bässler et al., Adv. Mater. 1995, 7, No. 6, 551; K. Nagaietal., Appl. Phys. Lett. 67 (16) 1995, 2281; EP-A 532 798.

The organic EL arrangements generally contain one or more layers of organic charge-transport compounds. The fundamental structure, in order of layers, is as follows:

1. carrier, substrate
2. basis electrode
3. hole-injecting layer
4. hole-transporting layer
5. light-emitting layer
6. electron-transporting layer
7. electron-injecting layer
8. top electrodes
9. contacts
10. case, encapsulation.

Layers 3 to 7 constitute the electroluminescent element.

This structure represents the most universal case and can be simplified by omitting individual layers, so that one layer assumes several functions. In the simplest case, an EL arrangement consists of two electrodes, between which there is an organic layer which fulfils all the functions, including that of light emission. Such systems are described, for example, in the Application WO 90/13148, based on poly(p-phenylenevinyls).

Multilayered systems can be built up by vapour-deposition processes, during which the layers are successively applied from the vapour phase, or by casting processes. Casting processes are preferred, because of the higher processing speeds. Admittedly, the partial solution of an already applied layer in the course of covering it with the next layer can be a difficulty in certain cases.

The object of the present invention is to provide electroluminescent arrangements which have high luminance and in which the mixture to be applied can be applied by casting.

It has been found that these requirements are met by electroluminescent arrangements containing the blend system specified below. In the following, the term "zone" is to be regarded as equivalent to "layer". The present invention accordingly provides electroluminescent arrangements containing a substrate, an anode, an electroluminescent element and a cathode, wherein at least one of the two electrodes is transparent in the visible spectral range and the electroluminescent element can contain, in order:

a hole-injecting zone, hole-transporting zone, electroluminescent zone, electron-transporting zone and/or an electron-injecting zone, characterised in that the hole-injecting and/or hole-transporting zone is an optionally substituted tris-1,3,5-(aminophenyl) benzene compound A) or a mixture thereof and the electroluminescent element contains optionally a further functionalised compound selected from among the hole-transporting materials, a luminescent material B) and optionally electron-transporting materials, and the hole-injecting and hole-transporting zone can contain one or more further hole-transporting compounds in addition to component A), at least one zone being present, individual zones can be omitted and the zone(s) present can assume one or more functions.

A zone can assume several functions; that is to say, a zone can contain, for example, hole-injecting, hole-transporting, electroluminescent, electron-injecting and/or electron-transporting substances.

The electroluminescent element can also contain one or more transparent polymeric binders C.

The optionally substituted tris-1,3,5-(aminophenyl) benzene compound A) represents an aromatic tertiary amino compound corresponding to the general formula (I)

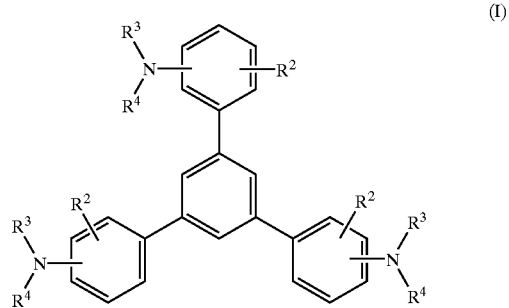

(I)

wherein
R² represents hydrogen, optionally substituted alkyl or halogen,
R³ and R⁴, independently of one another, represent optionally substituted $C_1$–$C_{10}$-alkyl, alkoxycarbonyl-substituted $C_1$–$C_{10}$-alkyl, optionally substituted aryl, optionally substituted aralkyl or optionally substituted cycloalkyl.
R³ and R⁴, independently of one another, represent preferably $C_1$–$C_6$-alkyl, in particular methyl, ethyl, n- or isopropyl, n-, iso-, sec.- or tert.-butyl, $C_1$–$C_4$-alkoxycarbonyl-$C_1$–$C_6$-alkyl, such as, for example, methoxy-, ethoxy-, propoxy-, butoxycarbonyl-$C_1$–$C_4$- alkyl; also phenyl-$C_1$–$C_4$-alkyl, naphthyl-$C_1$–$C_4$-alkyl, cyclopentyl, cyclohexyl, phenyl or naphthyl, in each case optionally substituted by $C_1$–$C_4$-alkyl and/or $C_1$–$C_4$-alkoxy.

Particularly preferably $R^3$ and $R^4$, independently of one another, represent unsubstituted phenyl or naphthyl, or phenyl or naphthyl each singly to triply substituted by methyl, ethyl, n-, isopropyl, methoxy, ethoxy, n- and/or isopropoxy.

$R^2$ represents preferably hydrogen, $C_1$–$C_6$-alkyl, such as, for example, methyl, ethyl, n- or isopropyl, n-, iso-, sec.- or tert.-butyl or chlorine.

Compounds such as these and their preparation are described in U.S. Pat. No. 4,923,774 for use in electrophotography, and the patent just cited is herewith expressly incorporated as part of the present description ("incorporated by reference"). The tris(nitrophenyl) compound can be converted into the tris(aminophenyl) compound, for example, by generally known catalytic hydrogenation, for instance, in the presence of Raney nickel (Houben-Weyl 4/1 C, 14-102, Ullmann (4) 13, 135–148). The amino compound is reacted with substituted halobenzenes in the generally known way.

The following compounds, wherein the substitution on the phenyl ring can be ortho, meta and/or para to the amine nitrogen, are given by way of example.

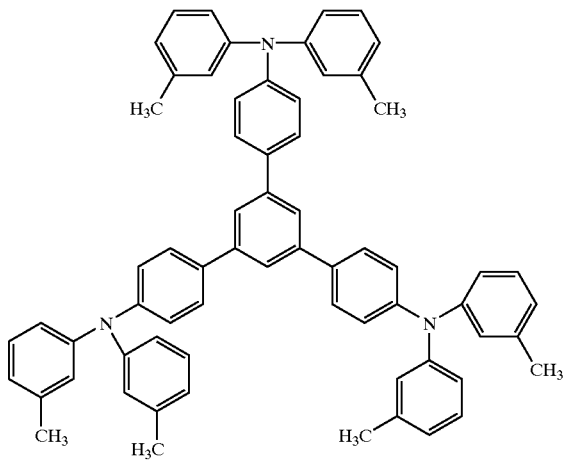

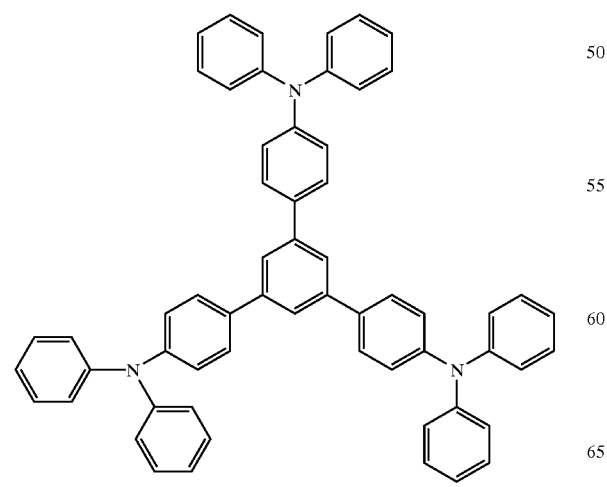

-continued

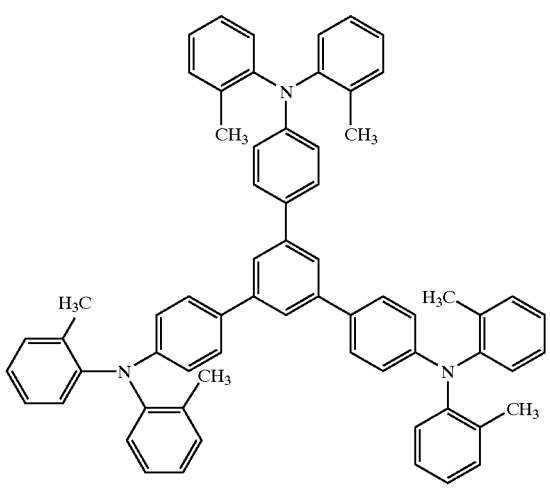

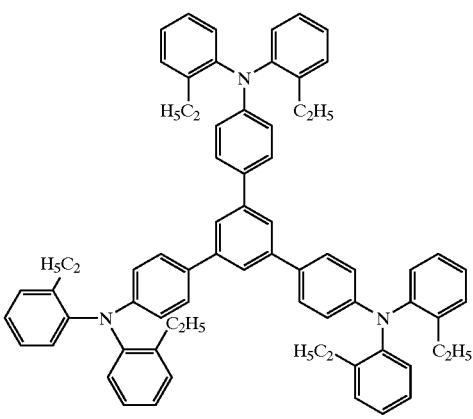

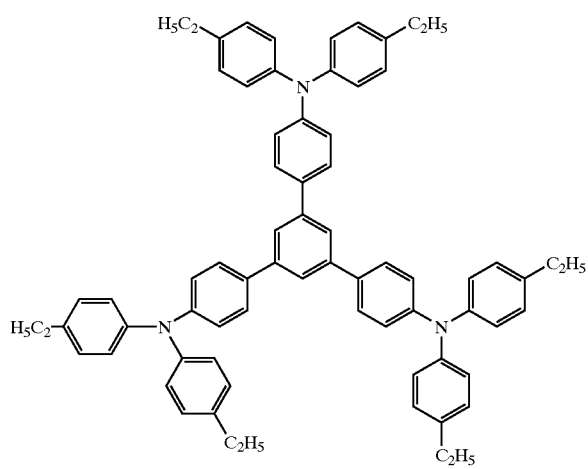
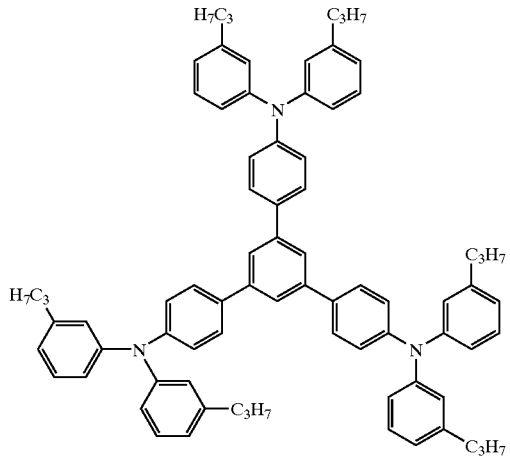
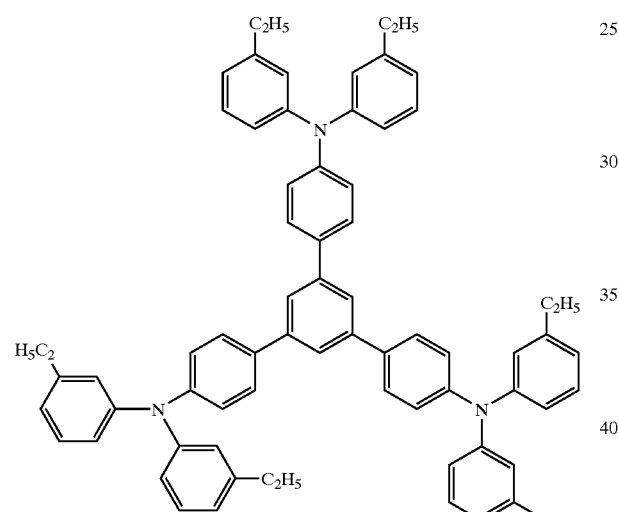
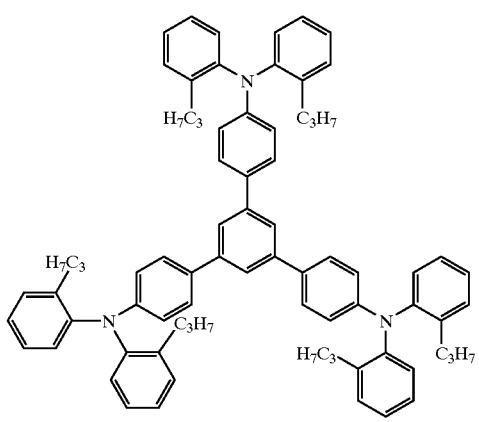
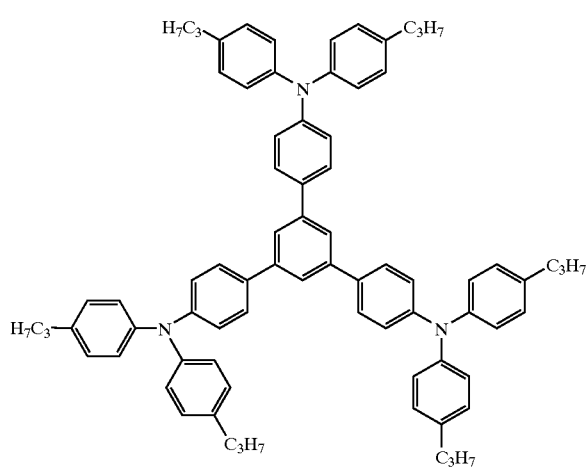
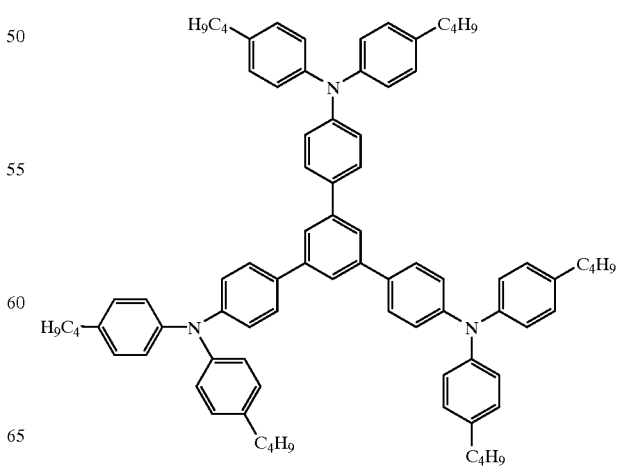

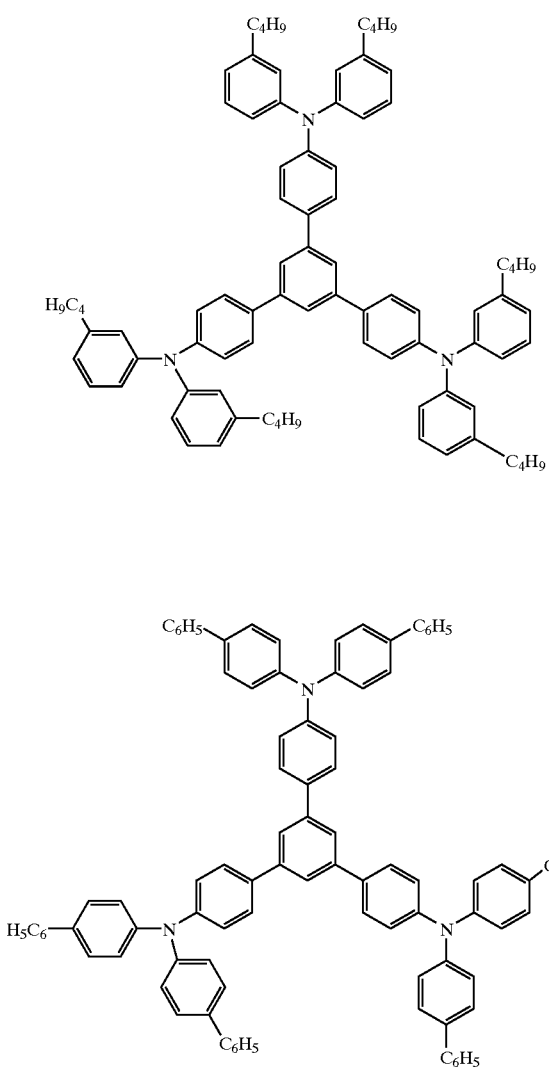
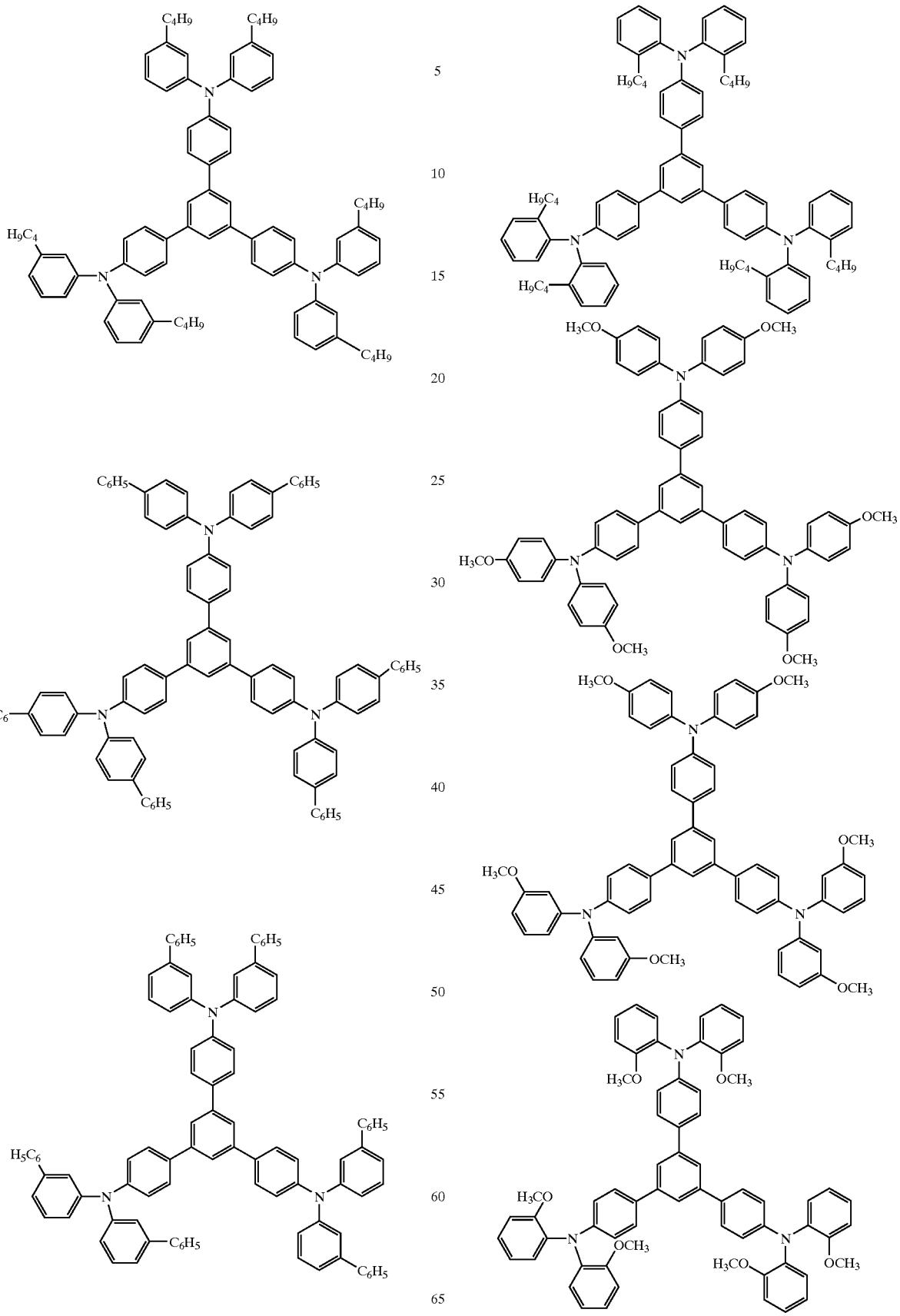

-continued
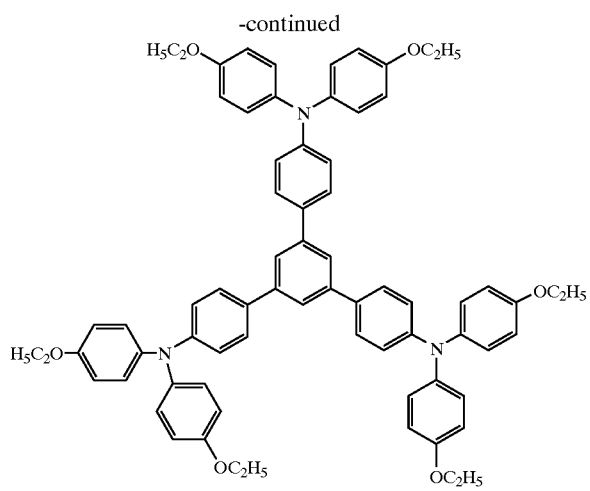
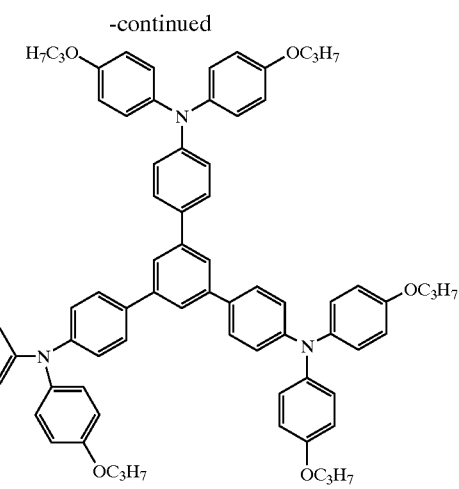
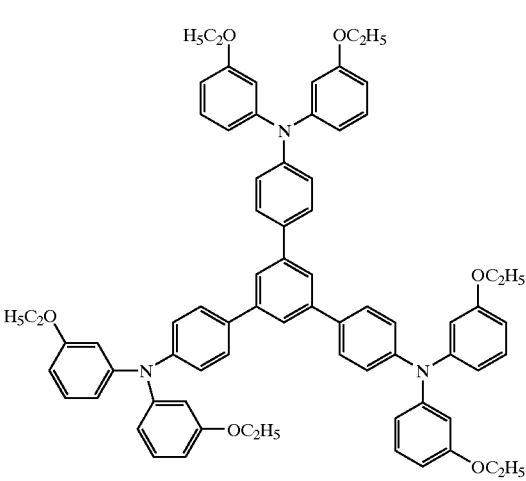
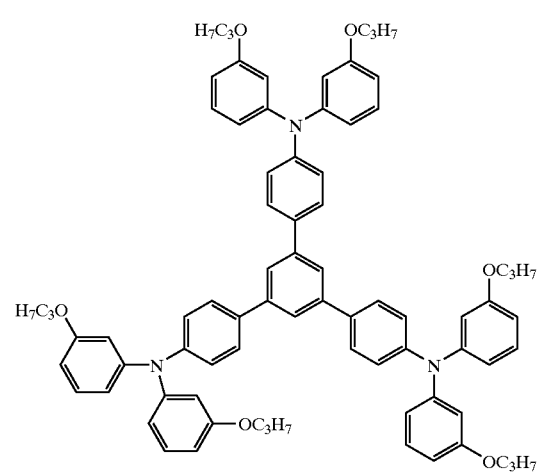
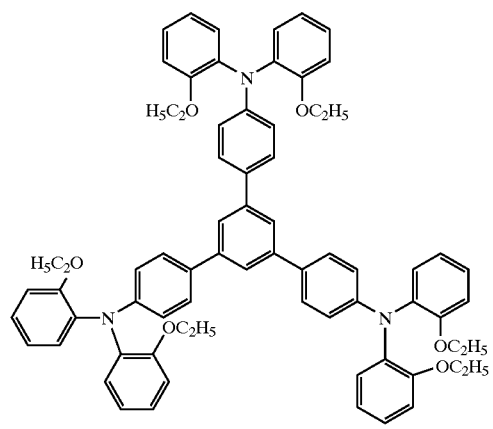
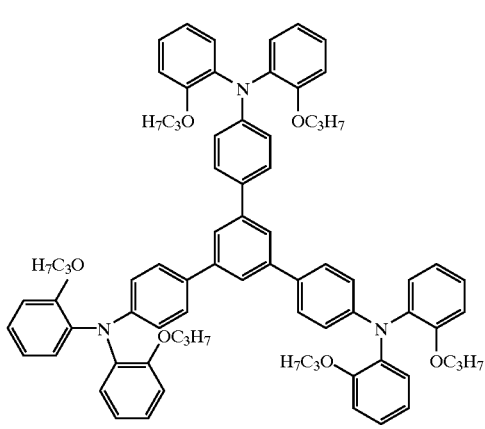

-continued
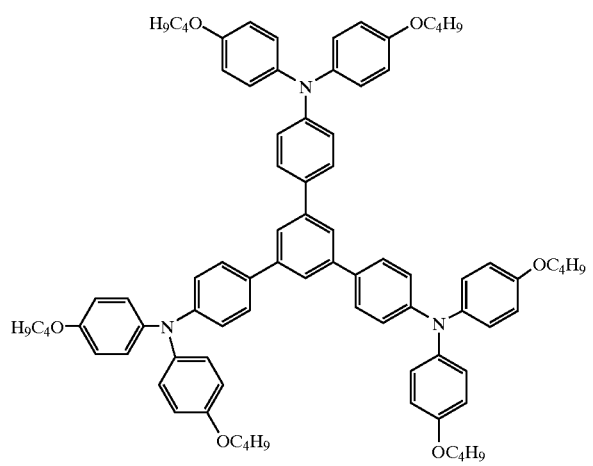
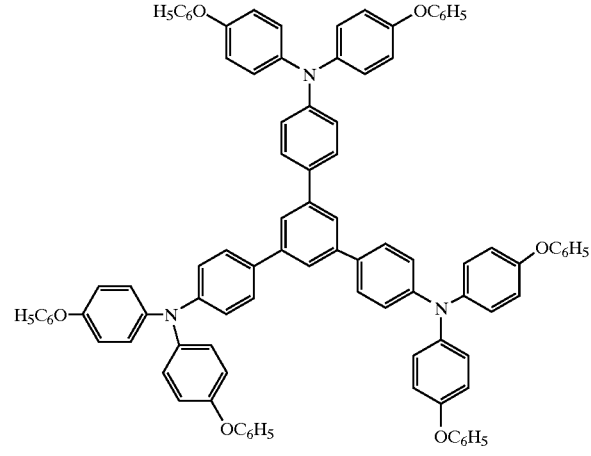
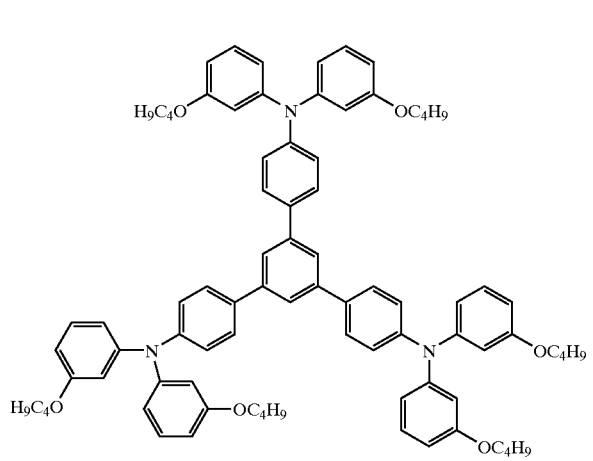
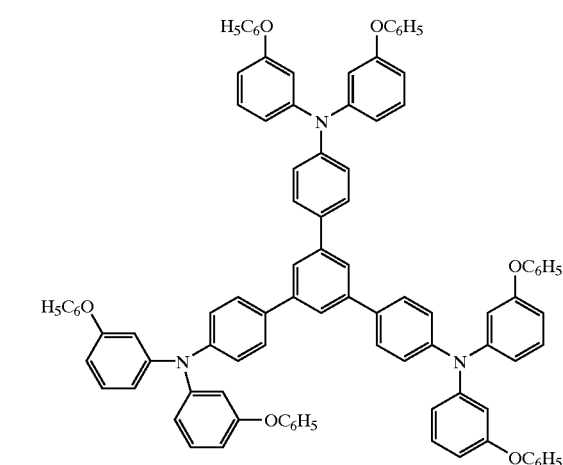
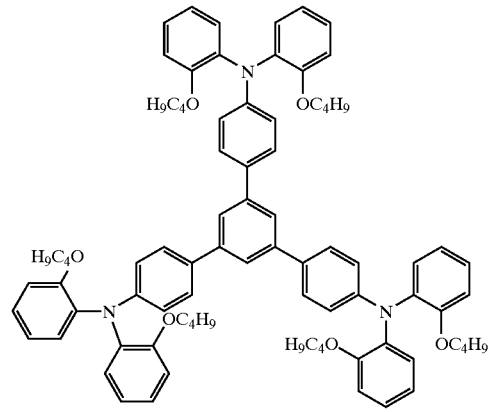
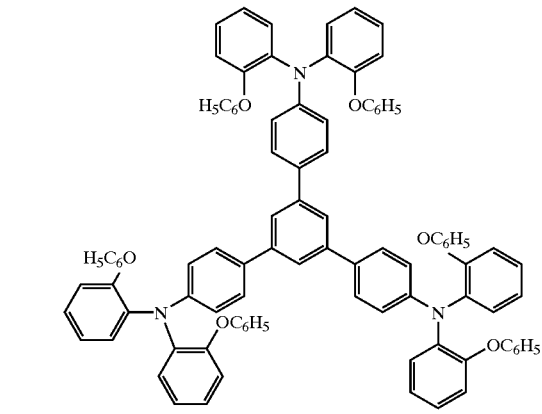

-continued
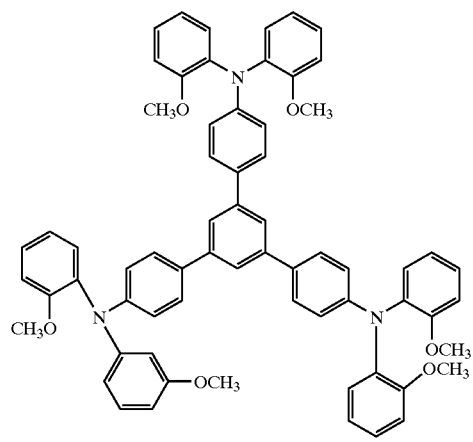
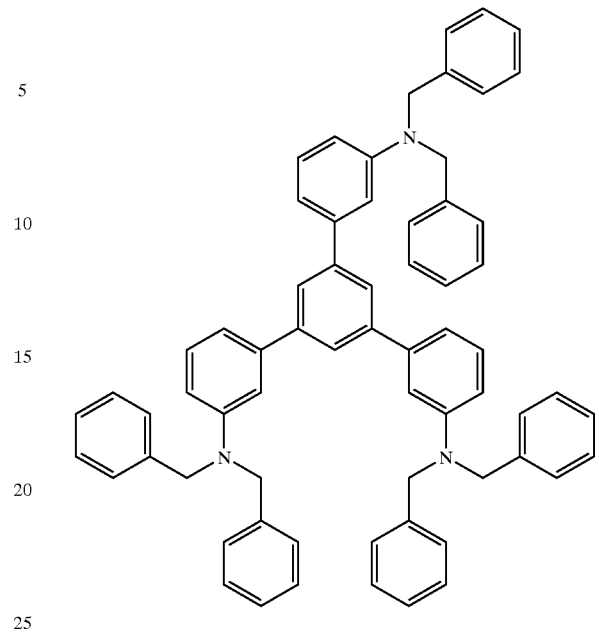
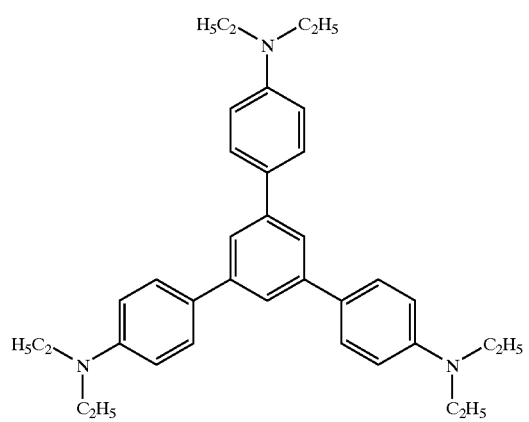
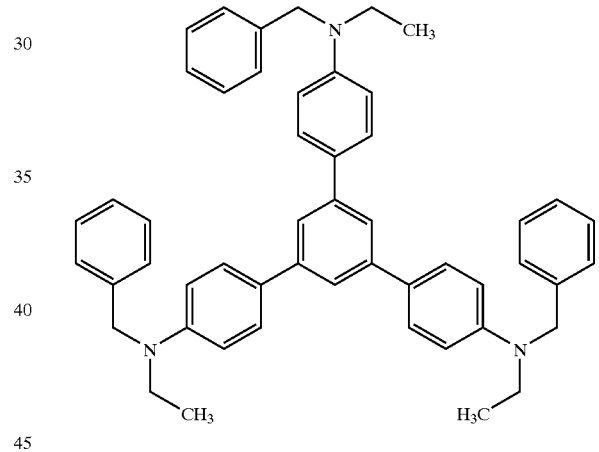
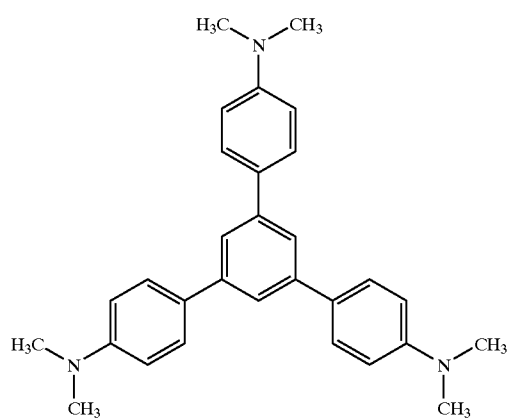
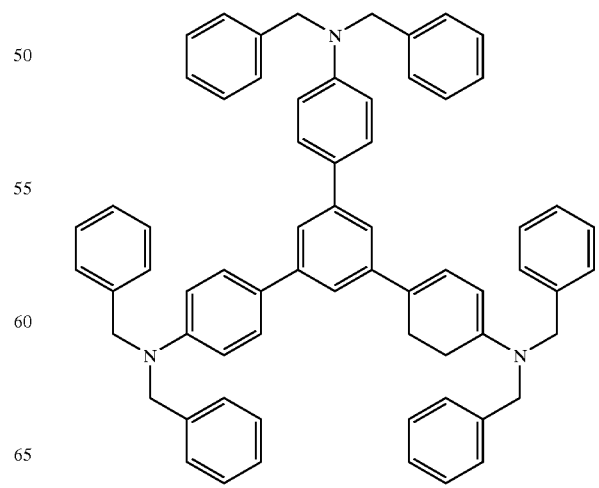

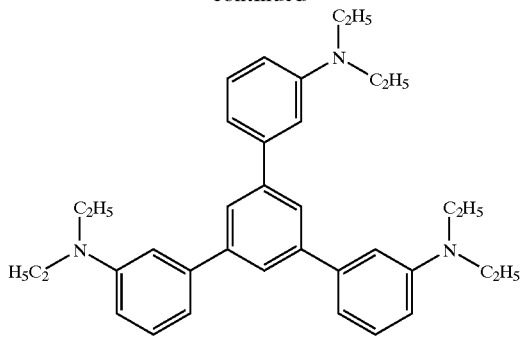

In addition to component A), further hole conductors, for example, in the form of a mixture with component A), may optionally be used for the construction of the electroluminescent element. These may on the one hand be one or more compounds corresponding to formula (I), also including mixtures of isomers; on the other hand they may also be mixtures of hole-transporting compounds with compounds of A)—corresponding to the general formula (I)—of different structure.

A list of possible hole-injecting and hole-conducting materials is given in EP-A 532 798.

In the case of mixtures of component A), the compounds may be used in any proportion between 0 and 100 wt. % (based on the mixture A)). In a preferred embodiment, 1 to 99 wt. % and 99 to 1 wt. %, particularly preferably 5 to 95 wt. % and 95 to 5 wt. %, are used. In another preferred embodiment, 30 to 70 wt. % and 70 to 30 wt. % are used.

Examples which may be given are:

anthracene compounds, for example, 2,6,9,10-tetraisopropoxyanthracene; oxadiazole compounds, for example, 2,5-bis(4-diethylaminophenyl)-1,3,4-oxadiazole; triphenylamine compounds, for example, N,N'-diphenyl-N,N'-di(3-methylphenyl)-1,1'-biphenyl-4,4'-diamine; aromatic tertiary amines, for example, N-phenylcarbazole, N-isopropylcarbazole and compounds which can be used in hole-transporting layers, such as are described in the Japanese Patent Application Offenlegungsnr. 62-264 692; also pyrazoline compounds, for example, 1-phenyl-3-(p-diethylamino-styryl)-5-(p-diethylaminophenyl)-2-pyrazoline; styryl compounds, for example, 9-(p-diethylaminostyryl) anthracene; hydrazone compounds, for example, bis(4-dimethylamino-2-methylphenyl) phenylmethane; stilbene compounds, for example, α-(4-methoxyphenyl)-4-N,N-diphenylamino(4'-methoxy) stilbene; enamine compounds, for example, 1,1-(4,4'-diethoxyphenyl)-N,N-(4,4'-dimethoxyphenyl)-enamine; metal phthalocyanines or nonmetal phthalocyanines and porphyrin compounds.

Triphenylamine compounds and/or aromatic tertiary amines are preferred, the compounds given above as examples being particularly preferred.

The following are examples of materials which have hole-conducting properties and can be used together with component A) in a mixture.

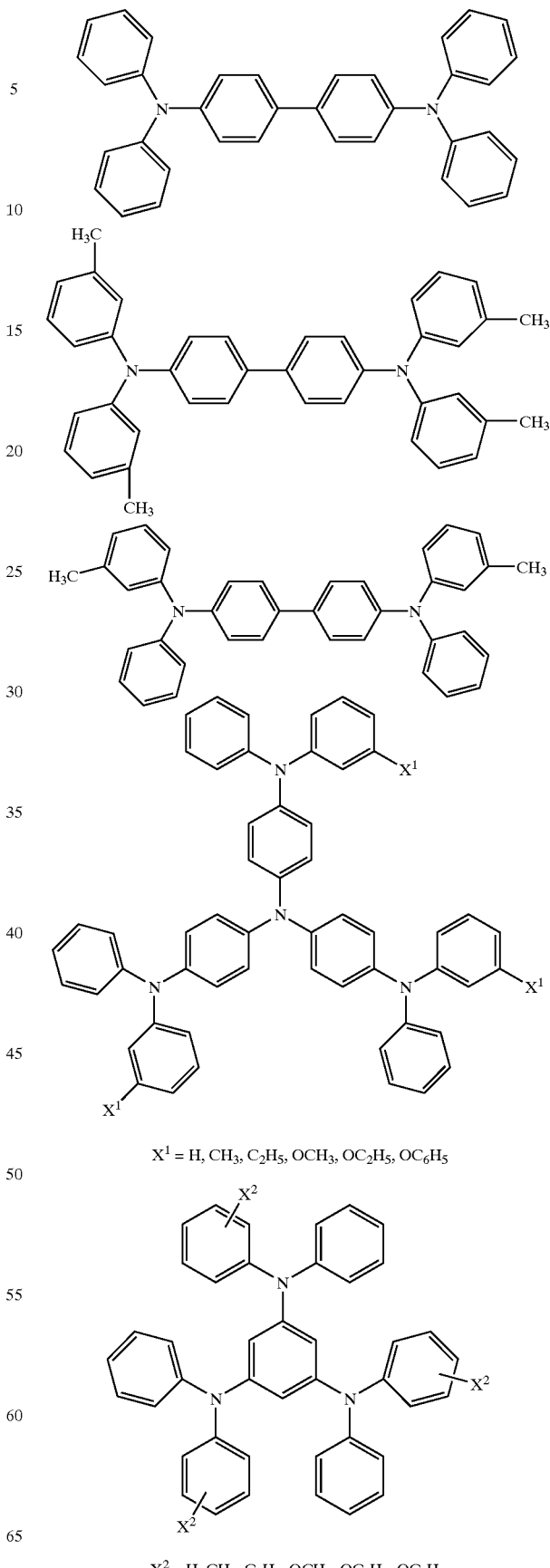

$X^1$ = H, CH$_3$, C$_2$H$_5$, OCH$_3$, OC$_2$H$_5$, OC$_6$H$_5$ $X^2$ = H, CH$_3$, C$_2$H$_5$, OCH$_3$, OC$_2$H$_5$, OC$_6$H$_5$

-continued

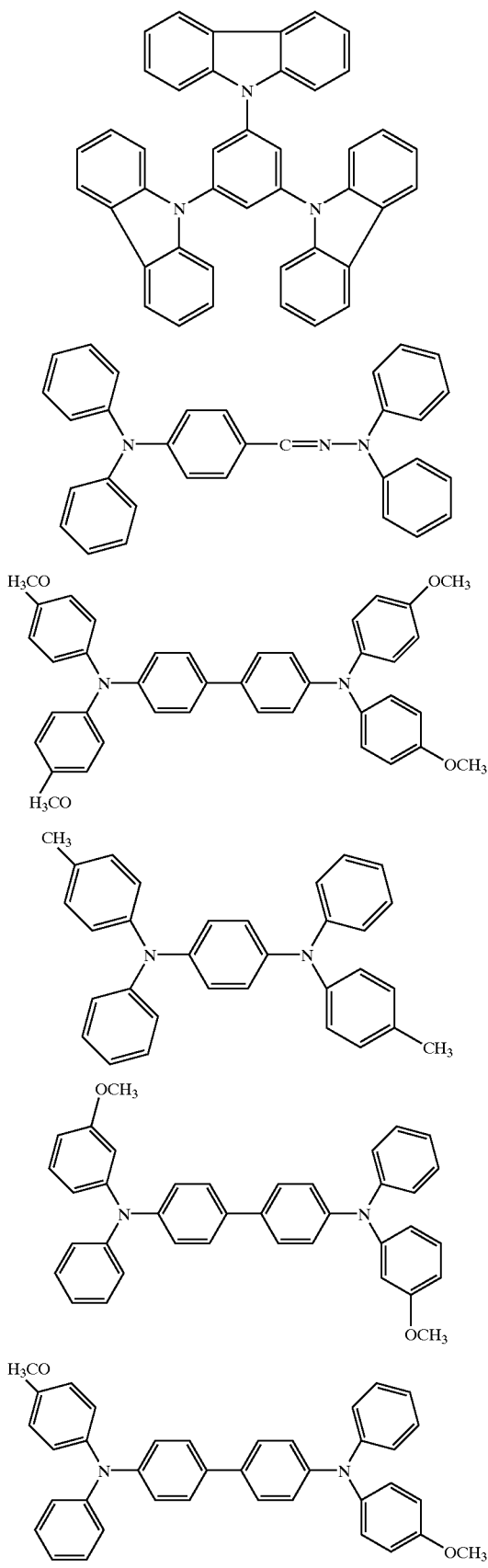

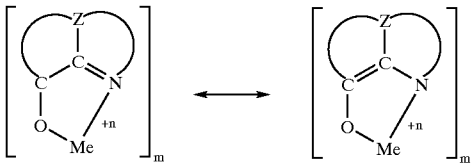

These and other examples are described in J. Phys. Chem. 1993, 97, 6240–6248 and Appl. Phys. Lett., Vol. 66, No. 20, 2679–2681. Binder C) represents polymers and/or copolymers such as, for example, polycarbonates, polyester carbonates, copolymers of styrene such as SAN or styrene acrylates, polysulfones, polymers based on monomers containing vinyl groups such as, for example, poly(meth) acrylates, polyvinylpyrrolidone, polyvinylcarbazole, vinyl acetate polymers and copolymers and vinyl alcohol polymers and copolymers, polyolefins, cyclic olefinic copolymers, phenoxy resins et cetera. Mixtures of different polymers can also be used. The polymeric binders C) have molecular weights of from 10,000 to 2,000,000 g/mol., are soluble and film-forming and are transparent in the visible spectral range. They are described, for example, in Encyclopedia of Polymer Science and Engineering, 2nd Edition, A. Wiley Interscience. They are conventionally used in a quantity of up to 95 wt.%, preferably up to 80 wt.%, based on the total weight of A) and B).

Component B) represents a compound corresponding to the general formula (II)

wherein

Me represents a metal, m is a number from 1 to 3 and

Z independently in both forms represents atoms which complete a nucleus which consists of at least 2 condensed rings.

In general monovalent, divalent or trivalent metals which are known to form chelates can be used.

The metal can be a monovalent, divalent or trivalent metal, for example, lithium, sodium, potassium, magnesium, calcium, boron or aluminium.

Z completes a heterocyclic molecular unit which consists of at least two condensed rings, of which one is an azole or azine ring, and further additional aliphatic or aromatic rings can be bonded to the two fused rings.

Suitable examples of component B) are the oxine complexes (8-hydroxyquinoline complexes) of $Al^{3+}$, $Mg^{2+}$, $In^{3+}$, $Ga^{3+}$, $Zn^{2+}$, $Be^{2+}$, $Li^+$, $Ca^{2+}$, $Na^+$ or aluminium tris(5-methyloxine)$_R$ and gallium tris(5-chloroquinoline). Complexes with rare earth metals can also be used.

Examples of component B) are

Alq₃  q = 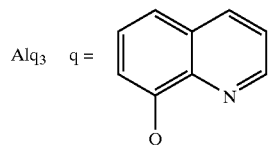

Inq₃, Gaq₃, Znq₂, Beq₂, Mgq₂,
or Al(qa)₃, Ga(qa)₃, In(qa)₃, Zn(qa)₂, Be(qa)₂, Mg(qa)₂,
wherein (qa) represents 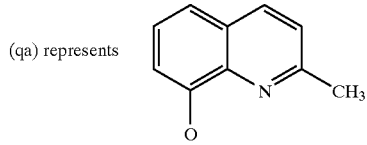

One or more component B) compounds can be used.

The compounds or the oxine complexes of component B) are generally known and can be prepared by known methods (cf. for example, U.S. Pat. No. 4,769,292).

The electroluminescent arrangements according to the invention are characterised by having a light-emitting layer which contains a mixture of the components A) and B) in optionally a transparent binder C). Here the weight ratio of A) and B) to one another is variably adjustable.

The percentage by weight of the sum of the percentages by weight of A) and B) in the polymeric binder is in the range of from 0.2 to 98 wt. %, preferably from 2 to 95 wt. %, particularly preferably from 10 to 90 wt. %, most preferably 10 to 85 wt. %.

The weight ratio A:B of components A) and B) is between 0.05 and 20, preferably 0.2 and 10 and particularly preferably between 0.3 and 8, in particular 0.3 and 7. Components A) and B) may consist either of one component or of a mixture of components of any composition.

To produce the layer, components A), B) and optionally C) are dissolved in a suitable solvent and by means of casting, knife-coating or spin-coating are applied to a suitable support. This can, for example, be glass or a plastics material provided with a transparent electrode. The plastics material used can be, for example, a sheet of polycarbonate, polyester such as polyethylene terephthalate or polyethylene naphthalate, polysulfone or polyimide.

Suitable transparent electrodes are
a) metal oxides, for example, indium-tin oxide (ITO), tin oxide (NESA), zinc oxide, doped tin oxide, doped zinc oxide, et cetera,
b) semi-transparent metal films, for example, Au, Pt, Ag, Cu, et cetera,
c) conductive polymer films such as polyanilines, polythiophenes, et cetera.

The metal oxide electrodes and the semi-transparent metal film electrodes are applied in a thin layer by techniques such as vapour deposition, sputtering, platinising, et cetera. The conductive polymer films are applied from solution by techniques such as spin-coating, casting, knife-coating, et cetera.

The thickness of the transparent electrodes is 3 nm up to about several $\mu$m, preferably 10 mn to 500 nm.

The electroluminescent layer is applied as a thin film directly to the transparent electrode or to an optionally present charge-transporting layer. The thickness of the film is 10 to 500 mn, preferably 20 to 400 mn, particularly preferably 50 to 250 nm.

An additional charge-transporting layer can be applied to the electroluminescent layer before a counterelectrode is applied.

A list of suitable charge-transporting intermediate layers, which can be hole-conducting and/or electron-conducting materials and can be in polymeric or low-molecular form, optionally as a blend, is given in EP-A 532 798. Specially substituted polythiophenes possessing hole-transporting properties are particularly suitable. They are described, for example, in EP-A 686 662.

The content of low-molecular hole conductors in a polymeric binder is variable within the range of 2 to 97 wt. %; the content is preferably 5 to 95 wt. %, particularly preferably 10 to 90 wt. %, in particular 10 to 85 wt. %. The hole-injecting and hole-conducting zones can be deposited by various methods.

Film-forming hole conductors can also be used in pure form (100%). The hole-injecting or hole-conducting zone may optionally also contain a proportion of an electroluminescent substance.

Blends which consist exclusively of low-molecular compounds can be vapour-deposited; soluble and film-forming blends, which in addition to low-molecular compounds may also (not necessarily) contain a binder C), can be deposited from a solution, for example, by means of spin-coating, casting, knife-coating.

It is also possible to apply emitting and/or electron-conducting substances in a separate layer to the hole-conducting layer containing component A). In this case an emitting substance ("dopant") can also be added to the layer containing component A) and in addition an electron-conducting substance can be applied. An electroluminescent substance can also be added to the electron-injecting or electron-conducting layer.

The content of low-molecular electron conductors in a polymeric binder is variable within the range of 2 to 95 wt. %; the content is preferably 5 to 90 wt. %, particularly preferably 10 to 85 wt. %. Film-forming electron conductors can also be used in pure form (100%).

The counterelectrode is composed of a conductive substance, which can be transparent. Preferred substances are metals, for example, Al, Au, Ag, Mg, In, et cetera, or alloys and oxides of these, which can be applied by techniques such as vapour-deposition, sputtering, platinising.

The arrangement according to the invention is brought into contact with the two electrodes by means of two electrical leads (for example, metal wires).

On the application of a direct-current voltage in the range of 0.1 to 100 volt, the arrangements emit light having a wavelength of 200 to 2000 nm. It displays luminescence in the range of 200 to 2000 nm.

The arrangements according to the invention are suitable for the production of units for illumination and for data presentation.

EXAMPLE 1

Electroluminescent arrangement based on a blend system consisting of

A:

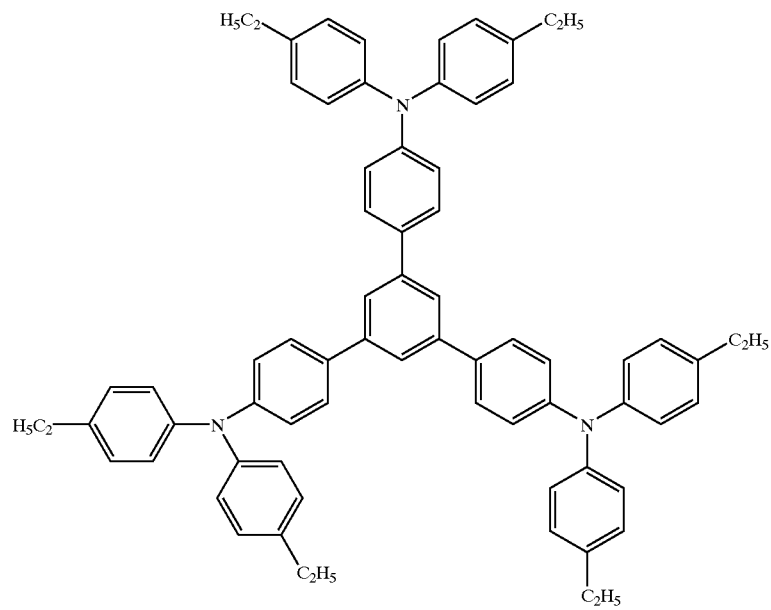

B:

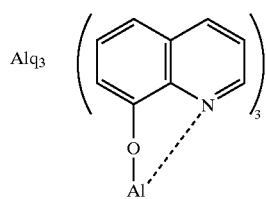

8-hydroxyquinoline aluminium salt (aluminium oxinate)

C: Polyvinylcarbazole (Luvican EP, BASF AG, Ludwigshafen, Germany)

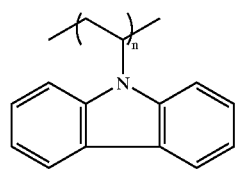

A 1% solution consisting of 1 part by weight A, 1 part by weight B and 4 parts by weight C in dichloroethane is spread out on a glass plate coated with ITO (Baltracon 255 from the firm Balzers) by means of a commercial spin-coater at a rate of rotation of 400/min.

The layer thickness is 100 nm.

As counterelectrode, Mg/Ag in the ratio of 10:1 is applied by thermal codeposition.

After contacting and application of an electrical field, from about 7 V the arrangement shows visually detectable electroluminescence in the green spectral range. The luminous intensity is 355 cd/m$^2$ at a current of 19 mA/cm$^2$ and a voltage of 16 V.

EXAMPLE 2

Electroluminescent arrangement based on a blend system consisting of:

A) 1 part by weight of the following compound:

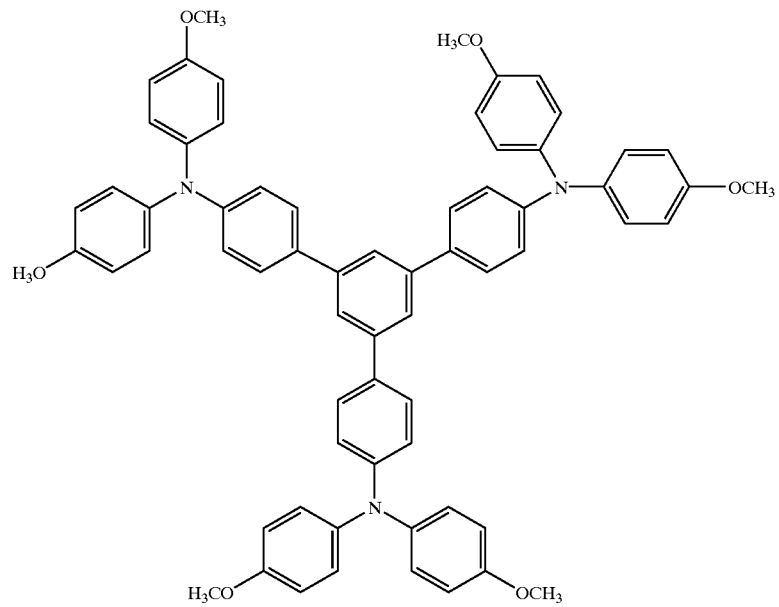

B) 1 part by weight Alq$_3$

C) 4 parts by weight polyvinylcarbazole (Luvican EP, BASF AG, Ludwigshafen, Germany).

Layer production and contacting are carried out as in Example 1. The luminous intensity at an applied voltage of 16 V and a current of 22.6 mA/cm$^2$ is 455 cd/M$^2$.

EXAMPLE 3

Electroluminescent arrangement based on a blend system consisting of:

A) 1 part by weight of the following compound:

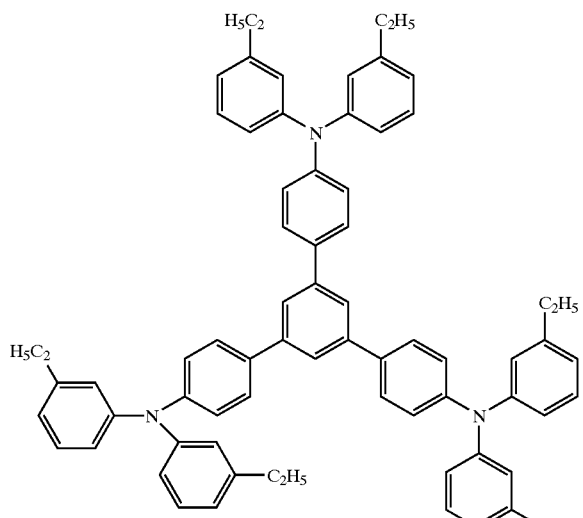

B) 1 part by weight Alq$_3$

C) 4 parts by weight polyvinylcarbazole (Luvican EP, BASF AG, Ludwigshafen, Germany).

Layer production and contacting are carried out as in Example 1. The luminous intensity at an applied voltage of 20 V and a current of 18.7 mA/cm$^2$ is 310 cd/m$^2$.

EXAMPLE 4

Electroluminescent arrangement based on a blend system consisting of:

A) 1 part by weight of the following compound:

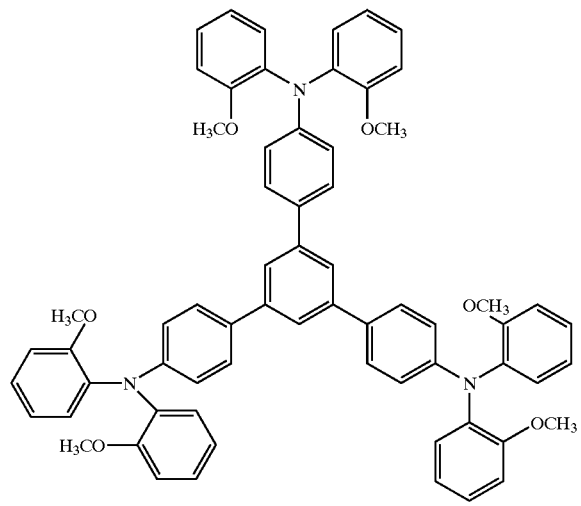

B) 1 part by weight Alq3

C) 4 parts by weight polyvinylcarbazole (Luvican EP, BASF AG, Ludwigshafen, Germany).

Layer production and contacting are carried out as in Example 1. The luminous intensity at an applied voltage of 15 V and a current of 17.6 mA/cm$^2$ is 250 cd/m$^2$.

EXAMPLE 5

Electroluminescent arrangement containing a hole-conducting layer based on

A) a mixture of the hole conductors (weight ratio 1:1)

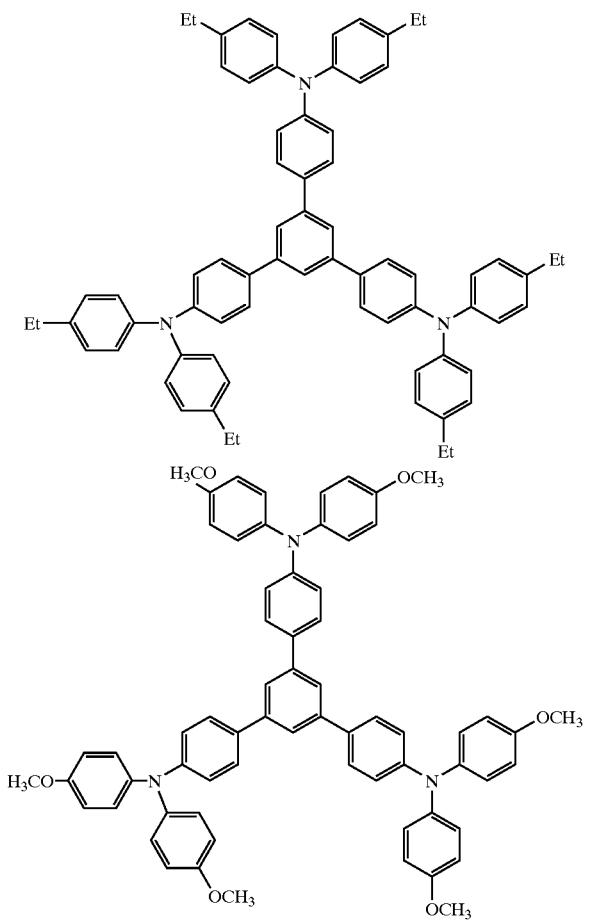

B) an electron-conducting or emitting layer based on

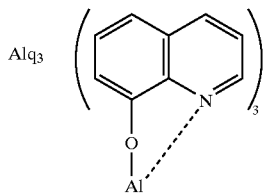

8-hydroxyquinoline aluminium salt (aluminium oxinate) and

C) polystyrene (Aldrich, 89555 Steinheim, Germany, product number: 18,242-7)

A 1% solution, consisting of 1 part by weight A, 1 part by weight B and 1 part by weight C in dichloroethane is spread out on a glass plate coated with ITO (Baltracon 255 from the firm Balzers) by means of a commercial spin-coater at a rate of rotation of 800/min. An electron-conducting or emitting layer, consisting of Alq$_3$, is vapour-deposited at $10^{-6}$ mbar onto this hole-conducting layer. The layer thickness is approximately 60 nm.

As counterelectrode, an Mg/Ag alloy in the ratio of 10:1 is applied by thermal codeposition. The system emits green light. The diode emits green light at a voltage of 3 V and above.

EXAMPLE 6

Electroluminescent arrangement based on component A:

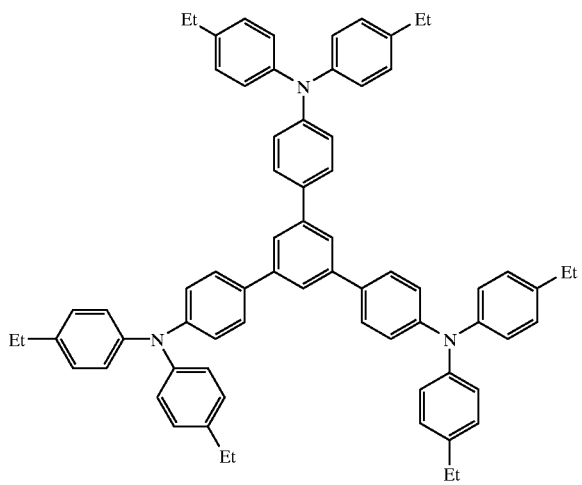

A 1.5% solution of A) in chloroform is spread out on a glass plate coated with ITO (Baltracon 255 from the firm Balzers) by means of a commercial spin-coater at a rate of rotation of 1000/min. The layer thickness is 120 nm.

As counterelectrode, Al is applied by thermal vaporisation.

After contacting and application of an electrical field, from 8 V electroluminescence can be detected by means of an Si photodiode. At a voltage of 20 V, a current of 25 mA/cm$^2$ flows and the luminance is 2 cd/m$^2$. The colour of the electroluminescence is blue.

What is claimed is:

1. An electroluminescent arrangement which comprises
a substrate,
an anode,
an electroluminescent element and
a cathode,
and said anode or said cathode is transparent in the visible spectral range and the electroluminescent element is a single layer consisting essentially of an optionally substituted tris-1,3,5-(aminophenyl)benzene compound A) or mixtures thereof, with optionally one or more hole-transporting compounds which have a structure different from formula (I),

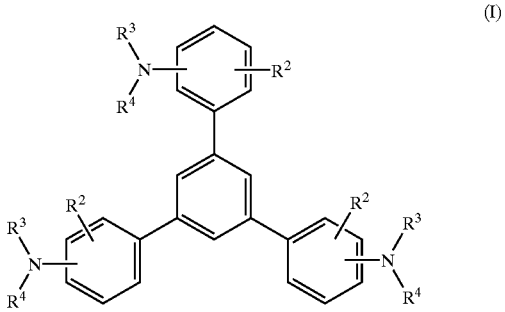

wherein

R$^2$ represents hydrogen, optionally substituted alkyl or halogen,

R$^3$ and R$^4$, independently of one another, represent optionally substituted C$_1$-C$_{10}$-alkyl, alkoxycarbonyl-substituted $C_1$–$C_{10}$-alkyl, optionally substituted aryl, optionally substituted aralkyl or optionally substituted cycloalkyl, a luminescent component B) which is a compound corresponding to formula (II):

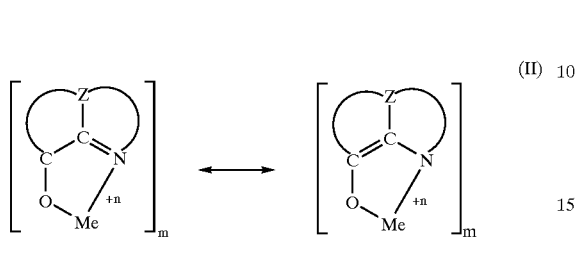

and wherein

Me represents a metal, m is a number from 1 to 3, n is 1,2 or 3 and z independently in both forms represents atoms which complete a nucleus which contains at least 2 condensed rings; or mixtures thereof; and optionally a transparent polymeric binder C).

2. The electroluminescent arrangement according to claim 1, wherein the compound A) is an aromatic tertiary amino compound corresponding to the general formula (I)

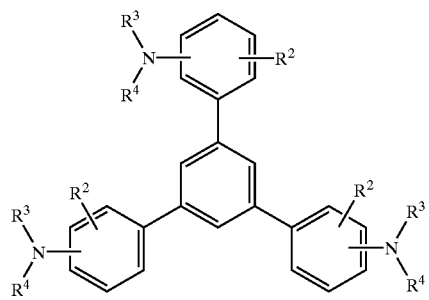

wherein $R^2$ represents hydrogen, optionally substituted alkyl or halogen, $R^3$ and $R^4$, independently of one another, represent optionally substituted $C_1$–$C_{10}$-alkyl, alkoxycarbonyl-substituted $C_1$–$C_{10}$-alkyl, optionally substituted aryl, optionally substituted aralkyl or optionally substituted cycloalkyl.

3. The electroluminescent arrangement according to claim 2, wherein in formula (I)

$R^2$ represents hydrogen or $C_1$–$C_6$-alkyl, $R^3$ and $R^4$, independently of one another, represent $C_1$–$C_6$-alkyl, $C_1$–$C_4$-alkoxycarbonyl-$C_1$–$C_6$-alkyl, phenyl, naphthyl, phenyl-$C_1$–$C_4$-alkyl, naphthyl-$C_1$–$C_4$-alkyl, cyclopentyl or cyclohexyl, in each case optionally substituted by $C_1$–$C_4$-alkyl, $C_1$–$C_4$-alkoxy or both $C_1$–$C_4$-alkyl and $C_1$–$C_4$-alkoxy.

4. Electroluminescent arrangement according to claim 1, wherein the compound A) is selected from the following compounds:

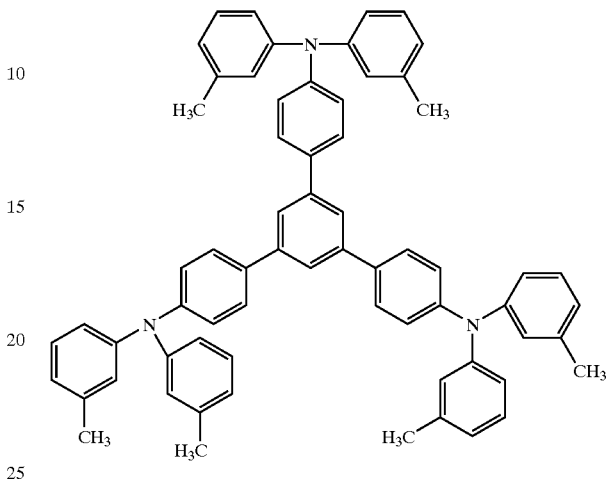

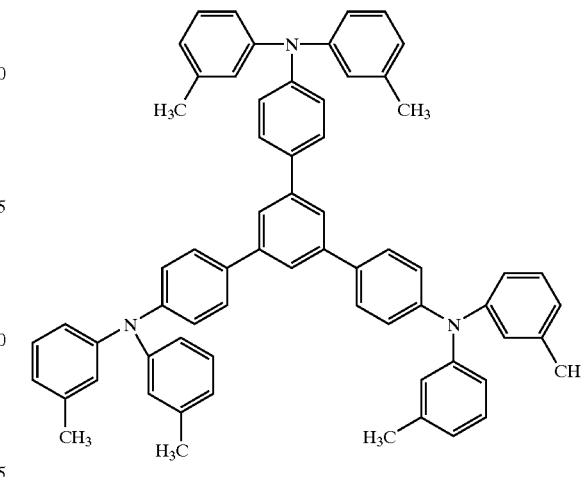

-continued
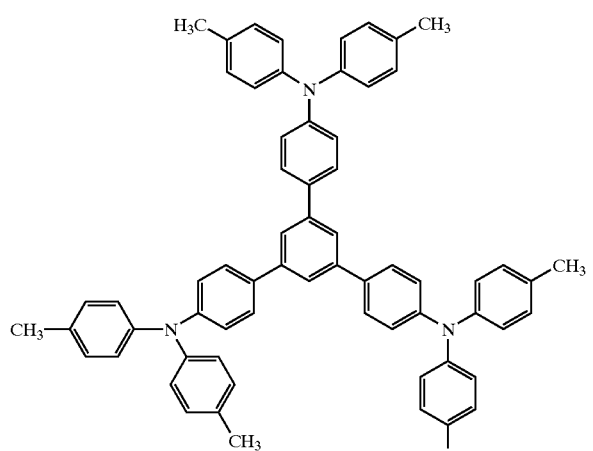
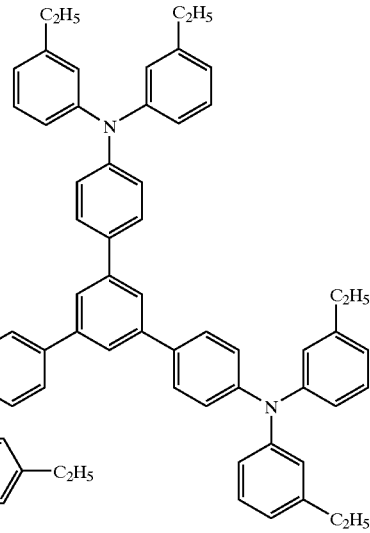
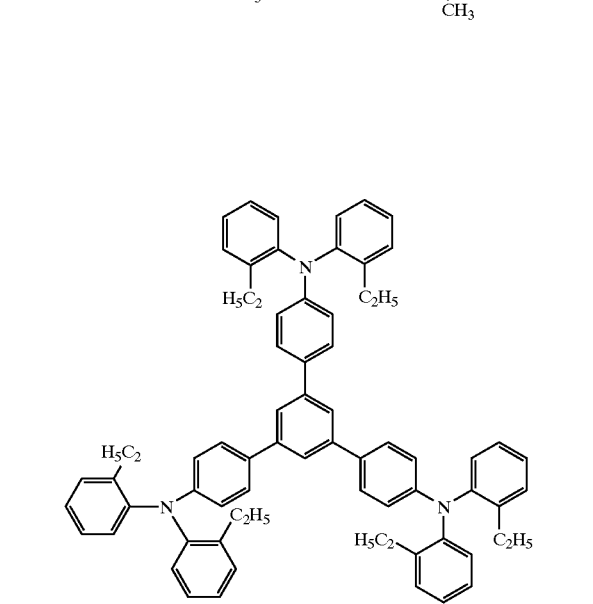
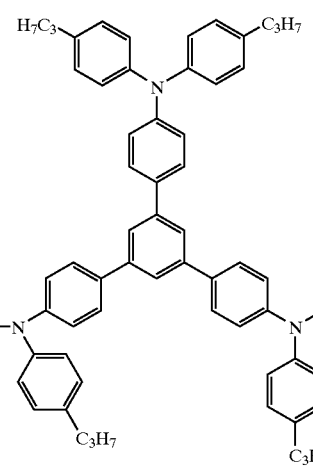
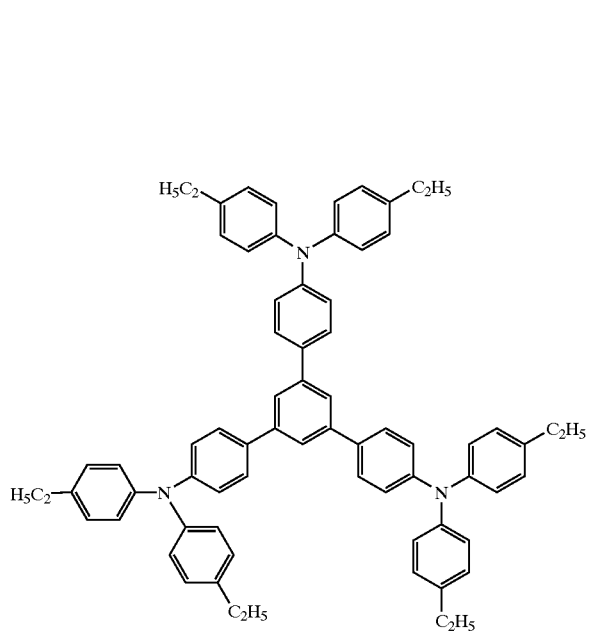
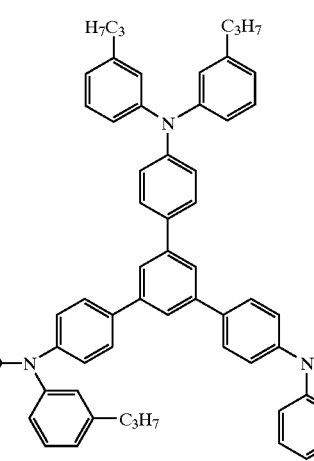

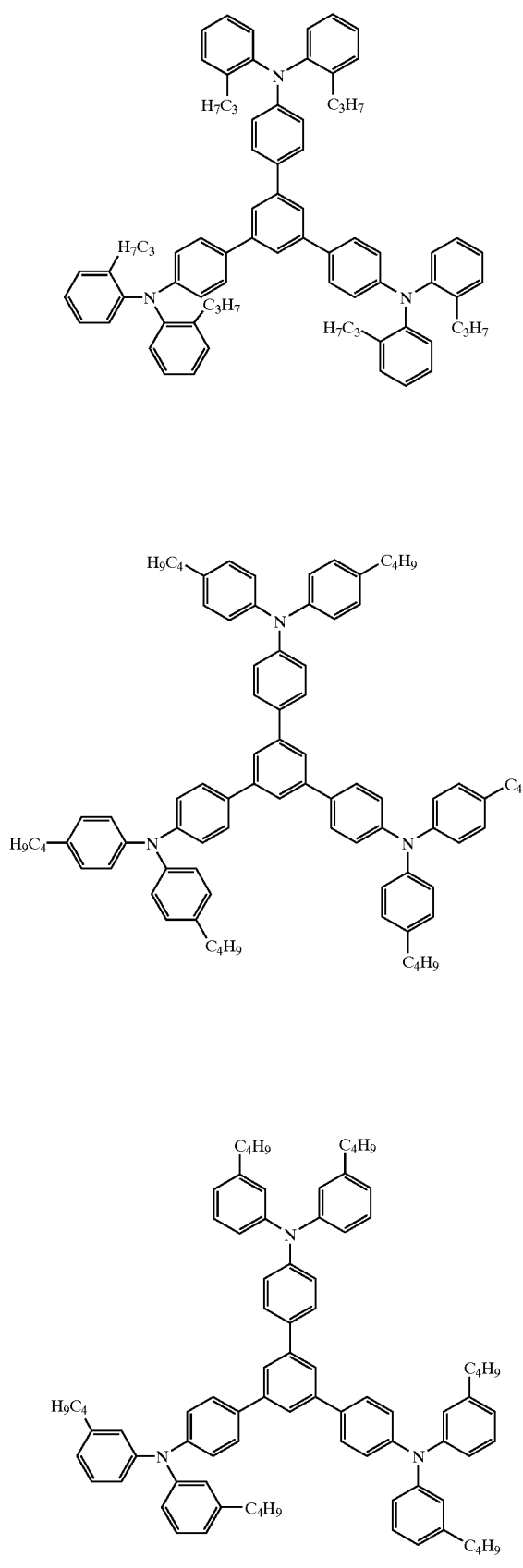
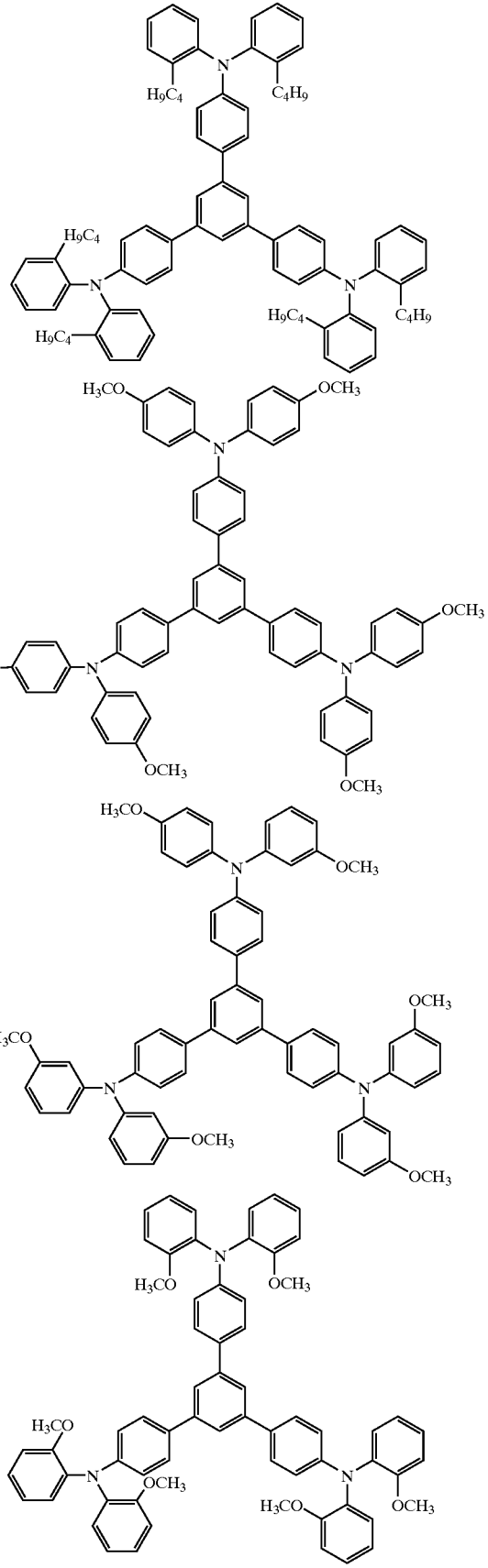

-continued
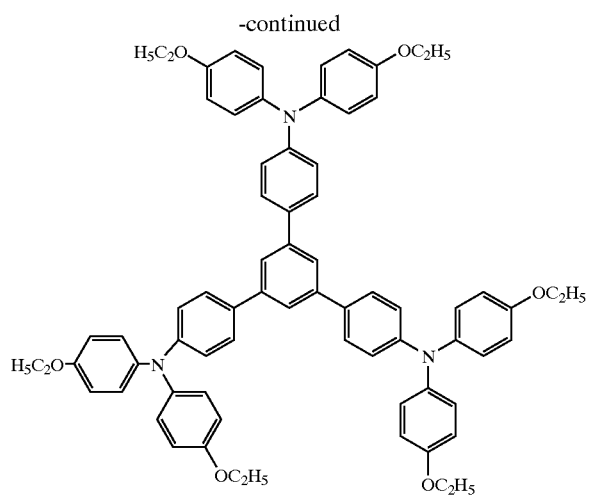
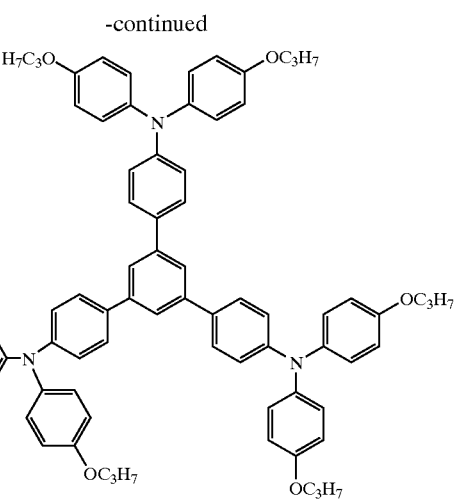
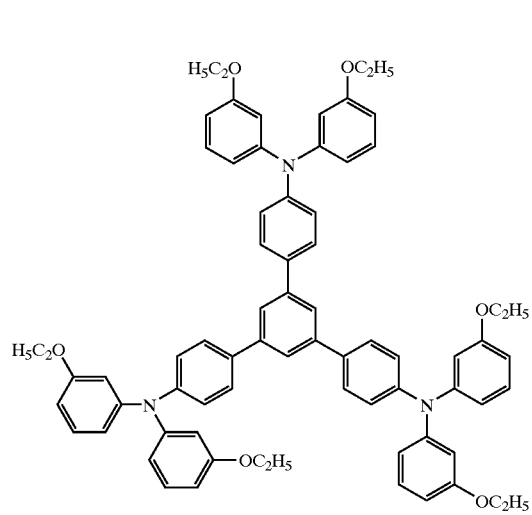
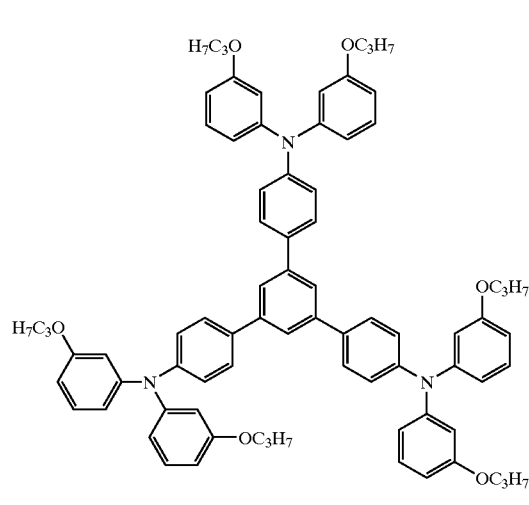
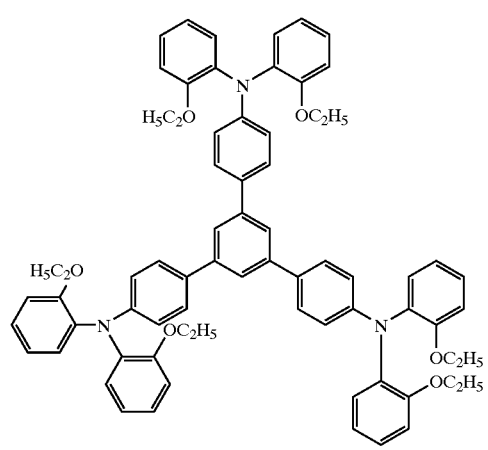
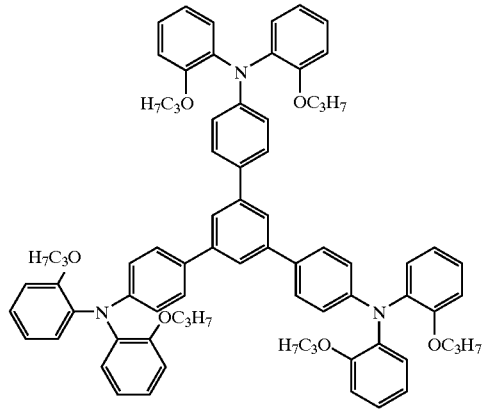

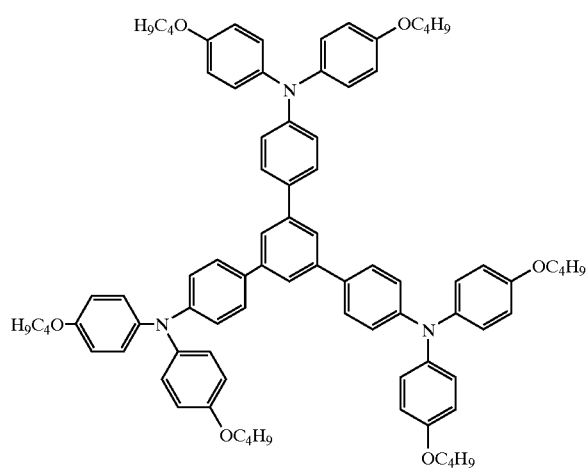
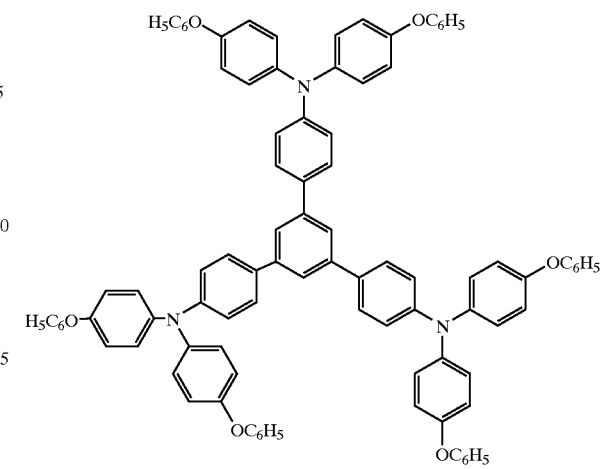
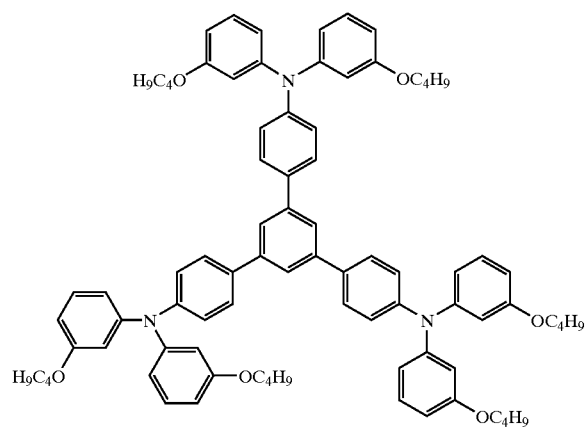
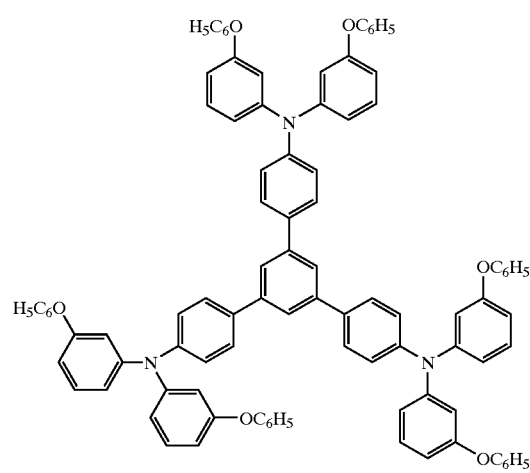
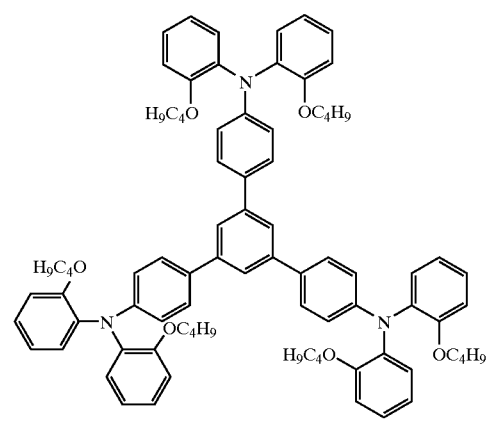
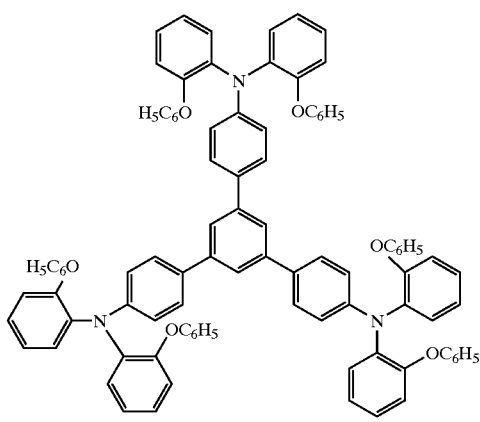

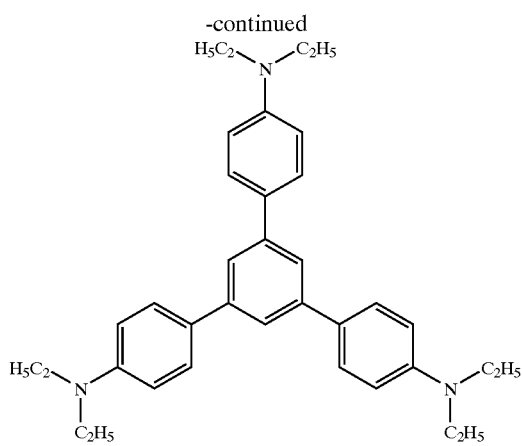
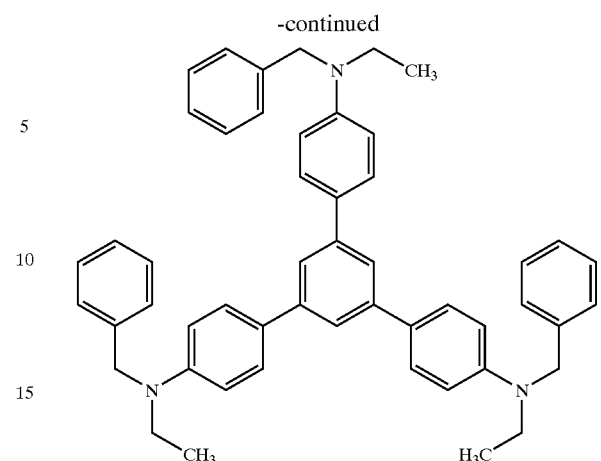
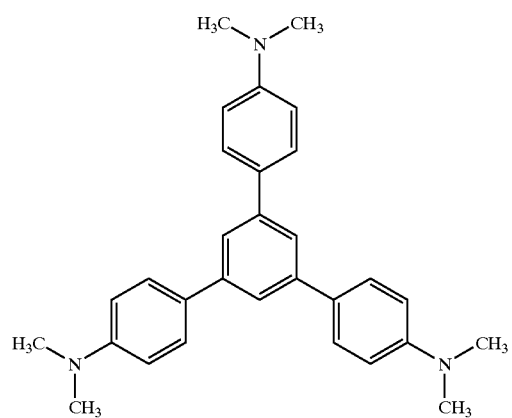
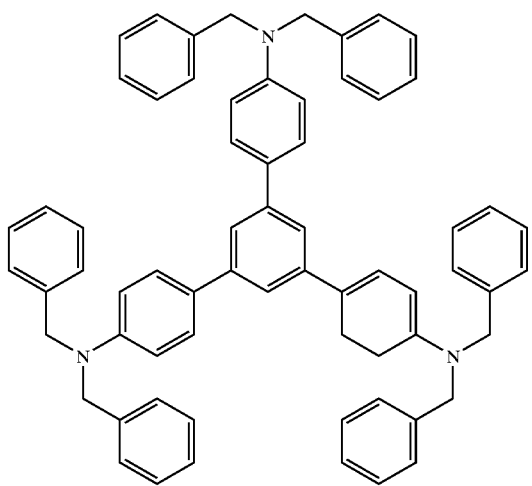
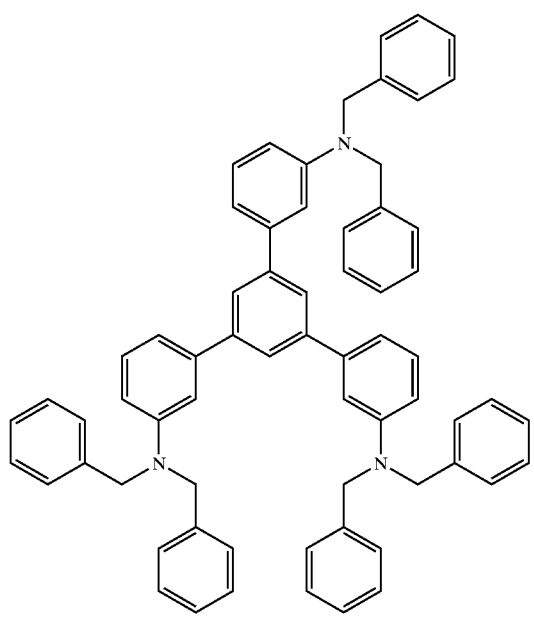
and
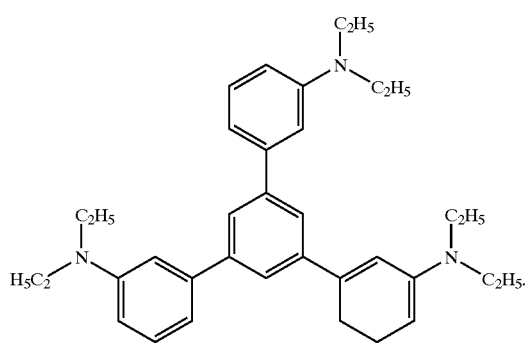

5. The electroluminescent arrangement according to claim 1, wherein component B) is selected from oxine complexes of $Al^{3+}$, $Mg^{2+}$, $In^{3+}$, $Li^{2+}$, $Ca^{2+}$, $Na^+$; aluminum tris(5-methyloxine); gallium tris(5-chloroquinoline) and rare earth metal complexes.

6. The electroluminescent arrangement according to claim 1, wherein the percentage by weight of the sum of the percentages by weight of A) and B) in the polymeric binder is in the range of from 0.2 to 98 wt. % (based on 100 wt. % of A)+B)+C)) and the weight ratio A):B) of components A) and B) is between 0.05 and 20.

7. The electroluminescent arrangement according to claim 1 wherein the transparent polymeric binder C) is selected from a group consisting of polycarbonates, polyester carbonates, copolymers of styrene, styrene acrylates, polysulfones, polymers based on monomers containing vinyl groups, polyolefins, cyclic olefinic copolymers and phenoxy resins.

8. An illumination which comprises electroluminescent arrangement according to claim 1.

9. A background illumination component which comprises an electroluminescent arrangement according to claim 1.

10. An electroluminescent arrangement which comprises a substrate, an anode, an electroluminescent element and a cathode, and said anode or said cathode is transparent in the visible spectral range and the electroluminescent element is a single layer containing an optionally substituted tris-1,3,5-(aminophenyl)benzene compound A), 8-hydroxyquinoline aluminum salt and polyvinylcarbazole.

11. The electroluminescent arrangement according to claim 10, wherein the electroluminescent element further contains a transparent polymeric binder C).

12. The electroluminescent arrangement according to claim 11, wherein the transparent polymeric binder C) is selected from a group consisting of polycarbonates, polyester carbonates, copolymers of styrene, styrene acrylates, polysulfones, polymers based on monomers containing vinyl groups, polyolefins, cyclic olefinic copolymers and phenoxy resins.

13. The electroluminescent arrangement according to claim 10, wherein the compound A) is selected from the following compounds:

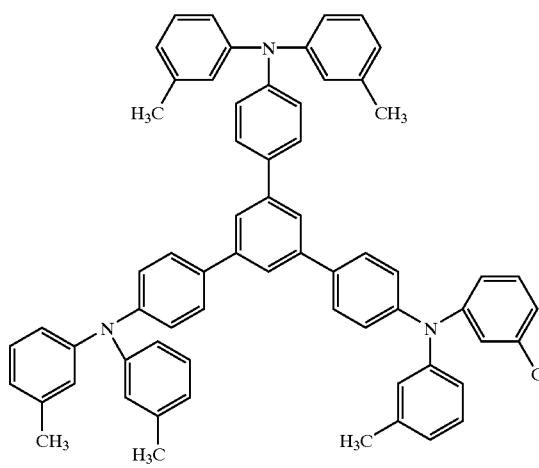

-continued

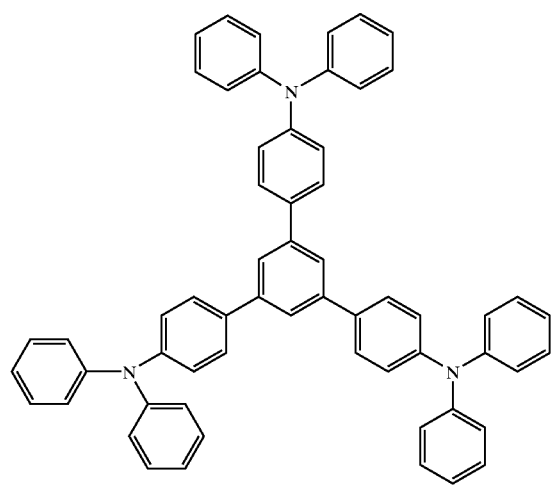

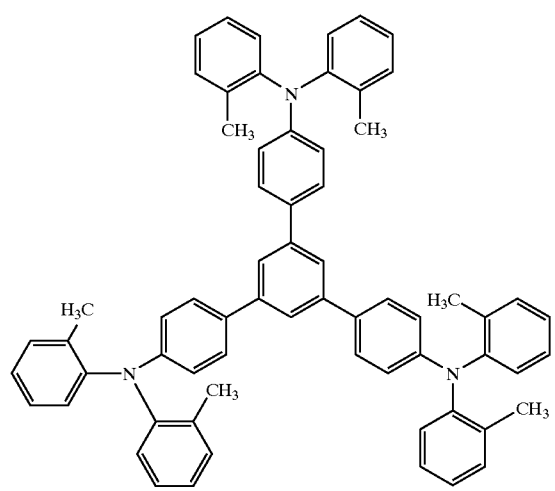

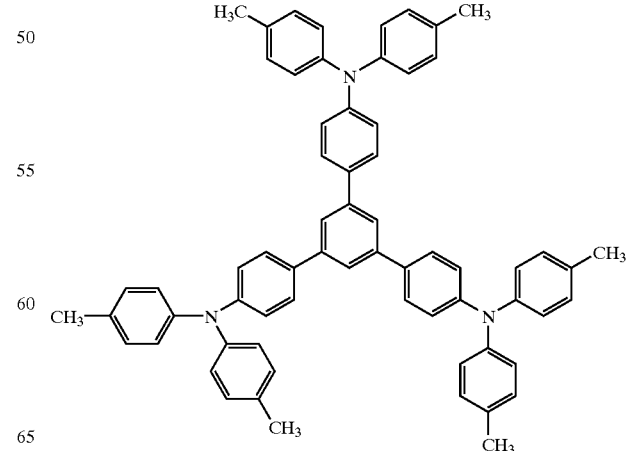

41
-continued
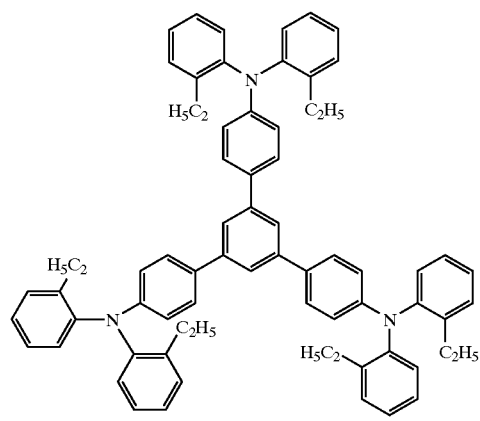
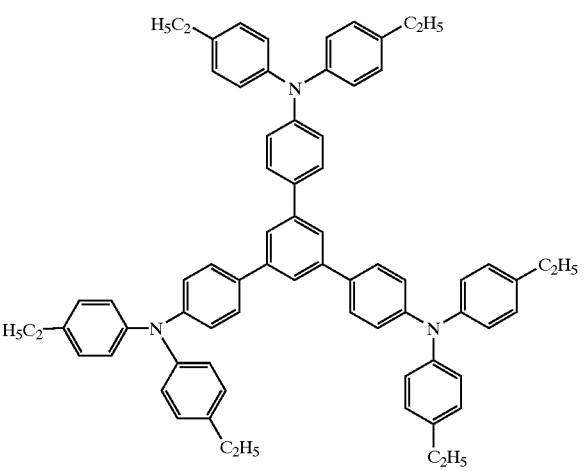
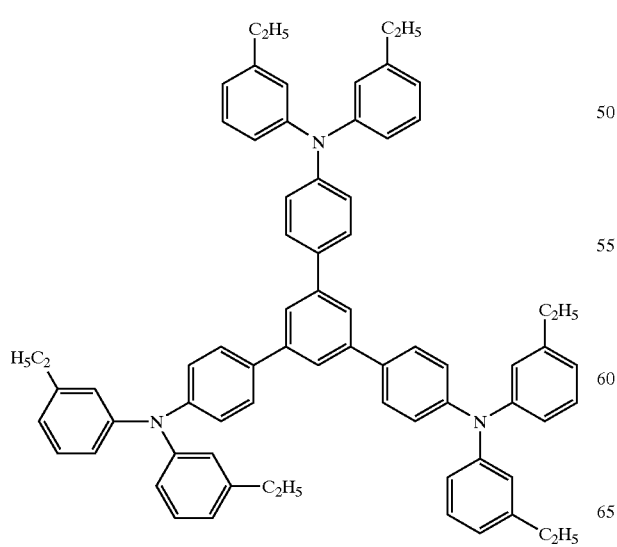
42
-continued
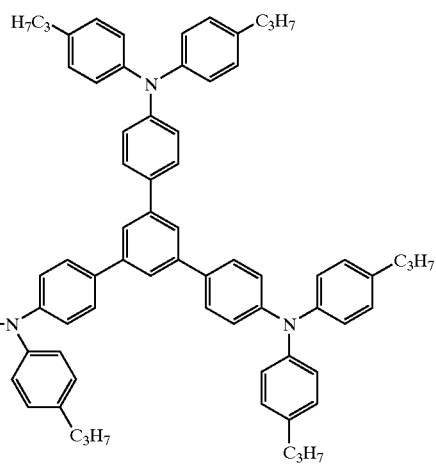
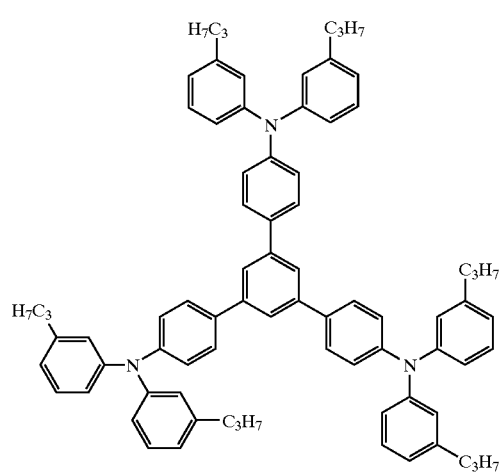
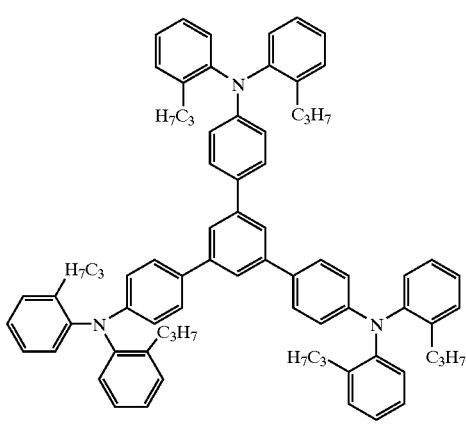

43
-continued
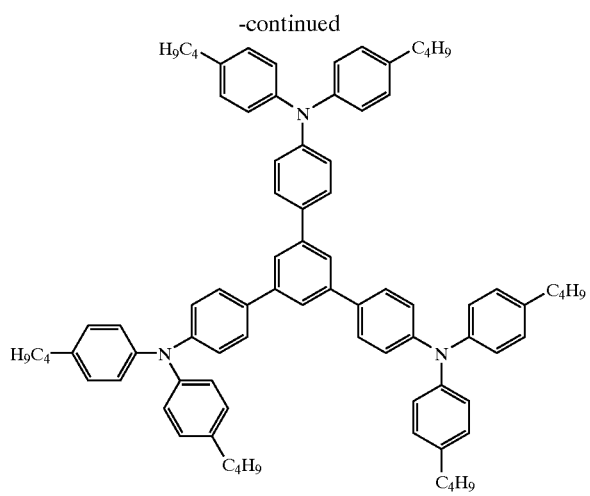
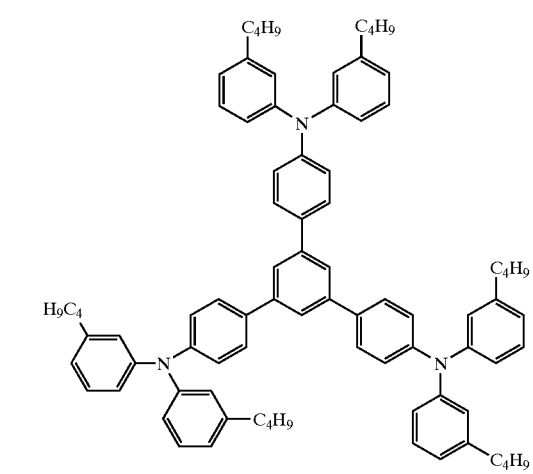
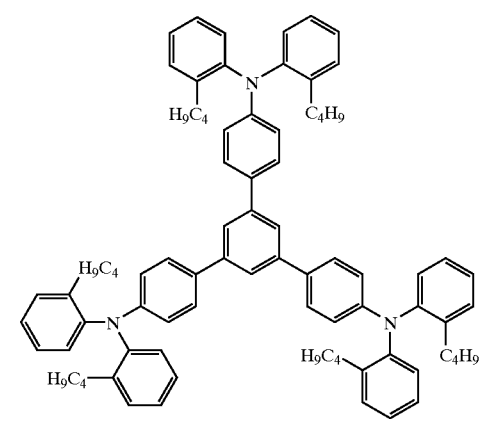
44
-continued
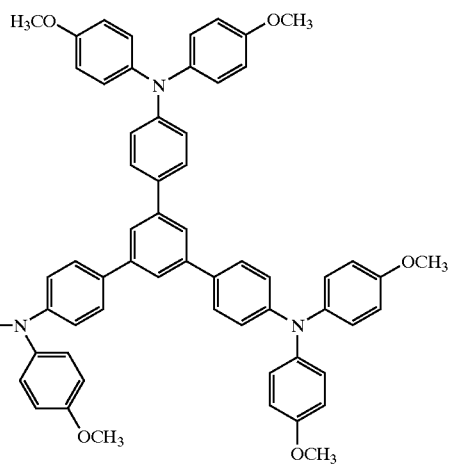
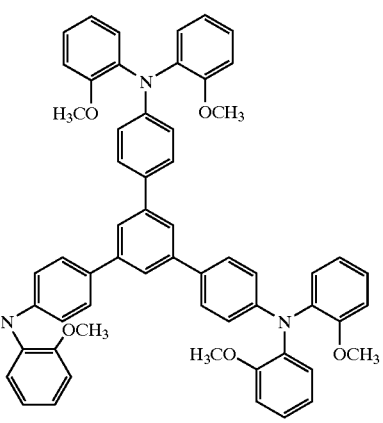

-continued
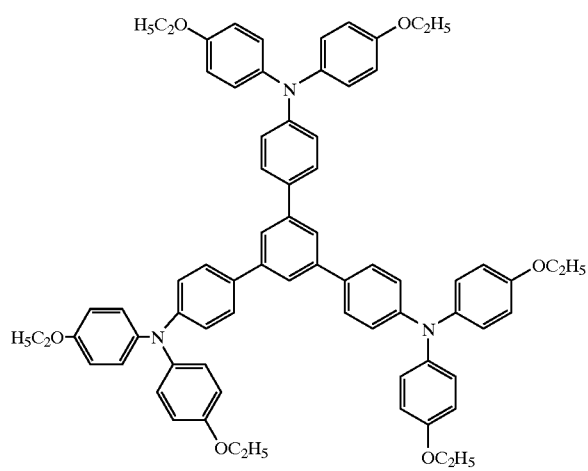
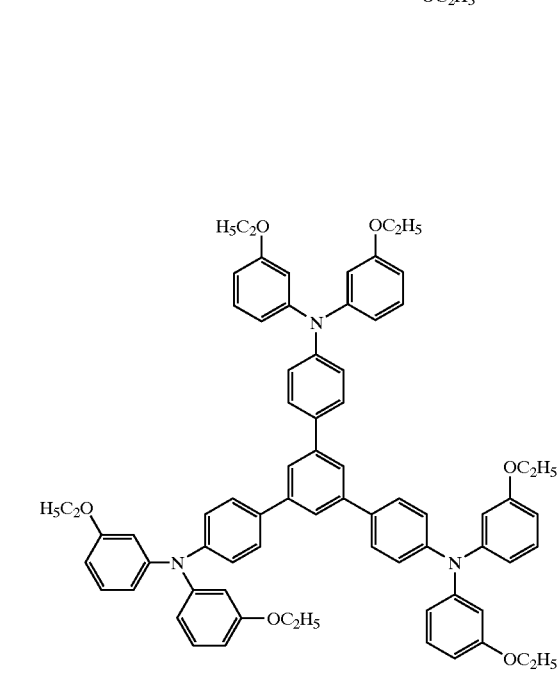
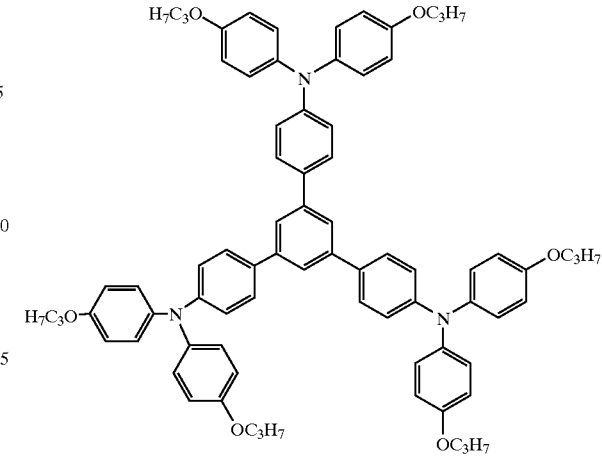
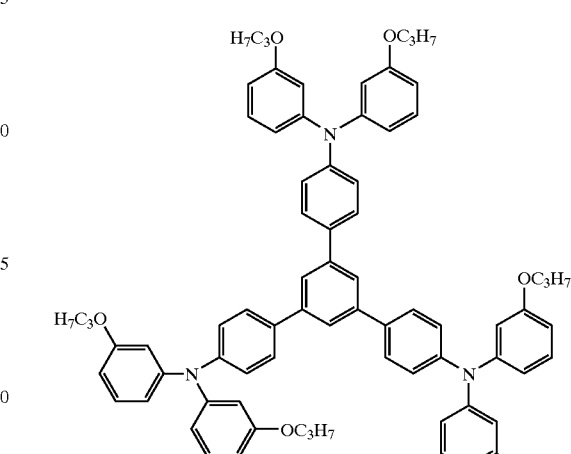
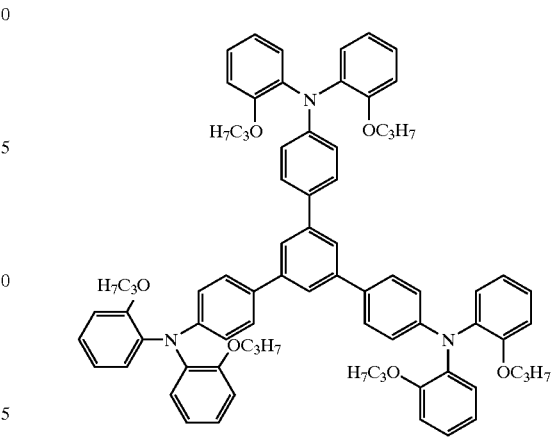

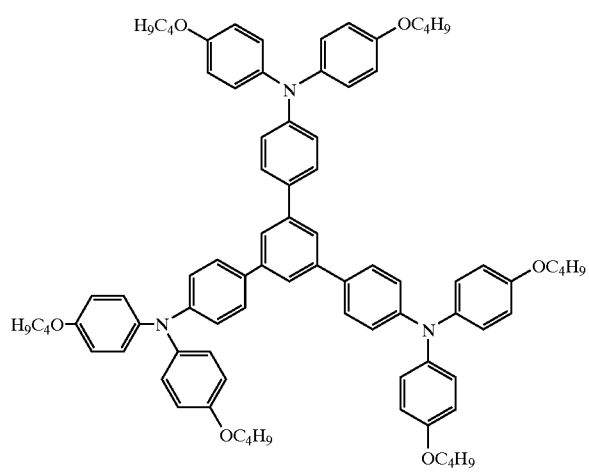
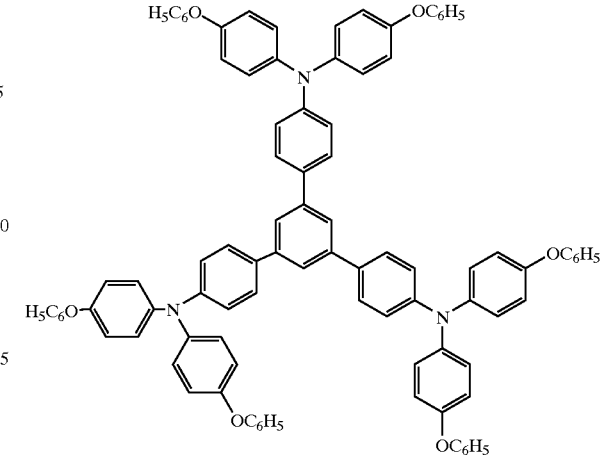
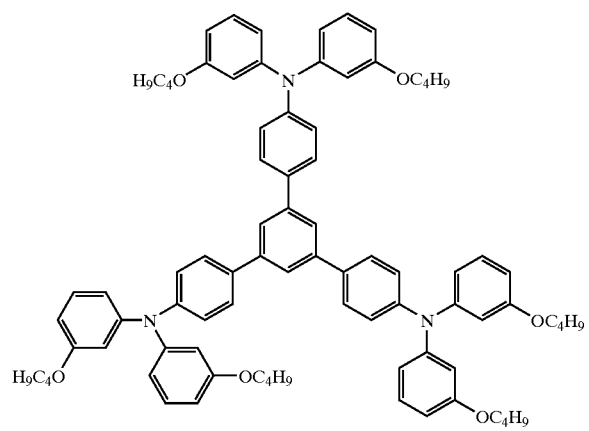
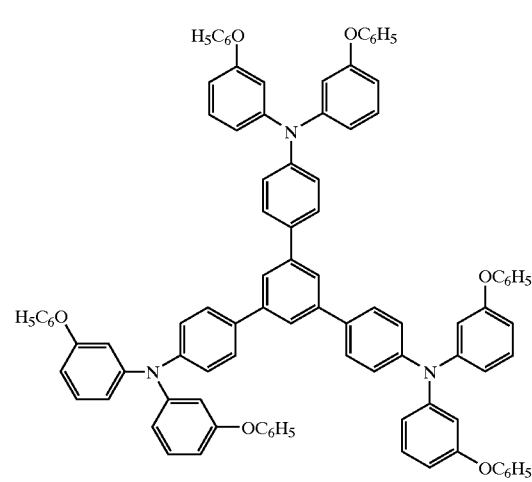
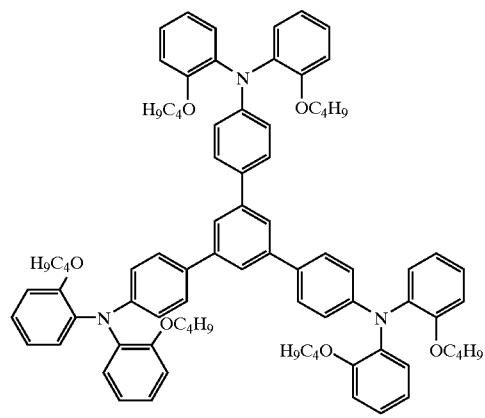
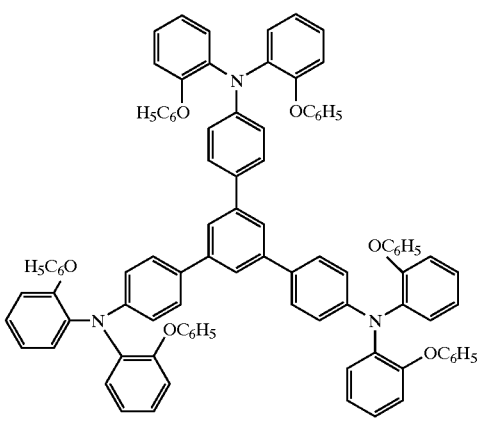

-continued

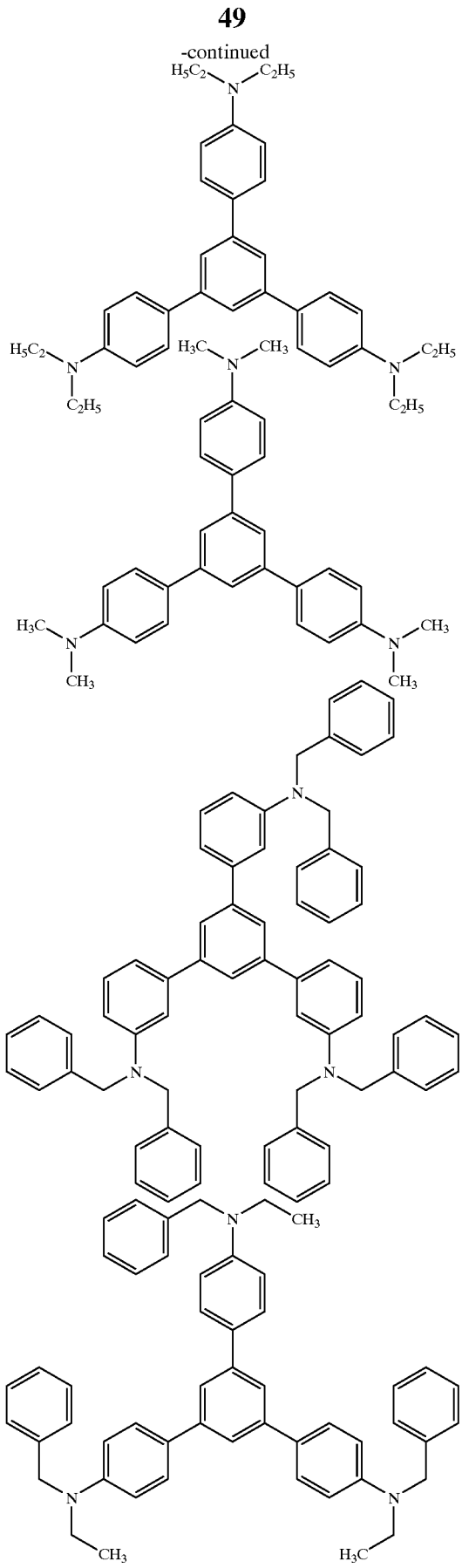

-continued

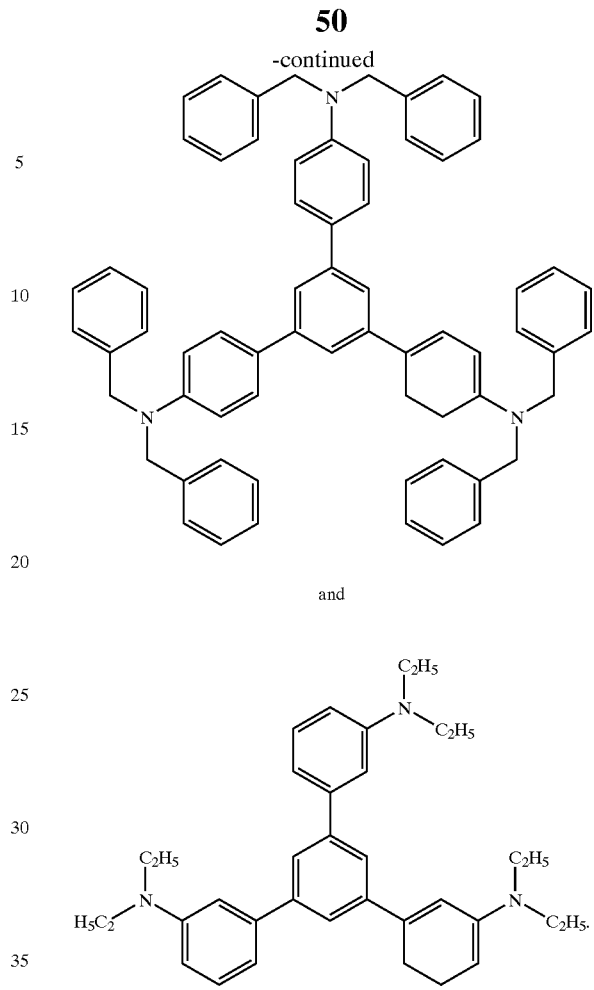

and

14. The electroluminescent arrangement according to claim 10, wherein the compound A) is an aromatic tertiary amino compound corresponding to the general formula (I)

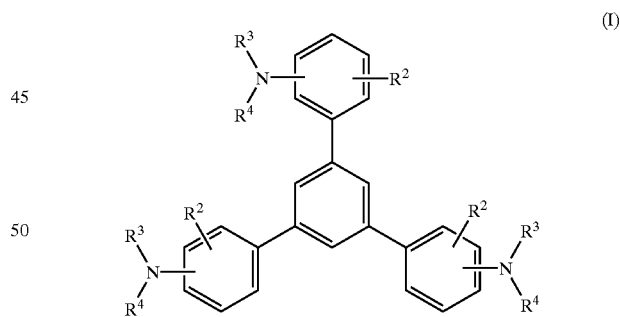

wherein
R² represents hydrogen, optionally substituted alkyl or halogen,
R³ and R⁴, independently of one another, represent optionally substituted $C_1$–$C_{10}$-alkyl, alkoxycarbonyl-substituted $C_1$–$C_{10}$-alkyl, optionally substituted aryl, optionally substituted aralkyl or optionally substituted cycloalkyl.

15. The electroluminescent arrangement according to claim 14, wherein said electroluminescent element further comprises one or more hole-transporting compounds which have a structure different from formula (I).

16. The electroluminescent arrangement according to claim 14 wherein in formula (I)

$R^2$ represents hydrogen or $C_1$–$C_6$-alkyl, $R^3$ and $R^4$, independently of one another, represent $C_1$–$C_6$-alkyl, $C_1$–$C_4$-alkoxycarbonyl-$C_1$–$C_6$-alkyl, phenyl, naphthyl, phenyl-$C_1$–$C_4$-alkyl, naphthyl-$C_1$–$C_4$-alkyl, cyclopentyl or cyclohexyl, in each case optionally substituted by $C_1$–$C_4$-alkyl, $C_1$–$C_4$-alkoxy or both $C_1$–$C_4$-alkyl and $C_1$–$C_4$-alkoxy.

17. An illumination which comprises electroluminescent arrangement according to claim 10.

18. A background illumination component which comprises an electroluminescent arrangement according to claim 10.

* * * * *